US009785277B2

(12) United States Patent
Azumi et al.

(10) Patent No.: US 9,785,277 B2
(45) Date of Patent: Oct. 10, 2017

(54) TOUCH DRIVE DEVICE, TOUCH DETECTION DEVICE AND DISPLAY DEVICE HAVING TOUCH DETECTION FUNCTION

(71) Applicant: Japan Display Inc., Minato-ku (JP)

(72) Inventors: Kohei Azumi, Tokyo (JP); Hidetoshi Komatsu, Tokyo (JP); Jin Ota, Tokyo (JP); Hiroshi Mizuhashi, Tokyo (JP); Makoto Hayashi, Tokyo (JP)

(73) Assignee: Japan Display Inc., Minato-ku (JP)

( * ) Notice: Subject to any disclaimer, the term of this patent is extended or adjusted under 35 U.S.C. 154(b) by 212 days.

(21) Appl. No.: 14/674,026

(22) Filed: Mar. 31, 2015

(65) Prior Publication Data
US 2015/0277657 A1 Oct. 1, 2015

(30) Foreign Application Priority Data

Mar. 31, 2014 (JP) ................................. 2014-071743
Mar. 13, 2015 (JP) ................................. 2015-051133

(51) Int. Cl.
*G06F 3/045* (2006.01)
*G06F 3/041* (2006.01)
(Continued)

(52) U.S. Cl.
CPC ............ *G06F 3/0416* (2013.01); *G06F 3/044* (2013.01); *G06F 3/0412* (2013.01);
(Continued)

(58) Field of Classification Search
CPC ...... G06F 3/0416; G06F 3/0412; G06F 3/044; G09G 3/3655; G09G 3/3648; G09G 2310/0286; G11C 19/28
See application file for complete search history.

(56) References Cited

U.S. PATENT DOCUMENTS

2002/0097208 A1* 7/2002 Hashimoto .......... G09G 3/3607
345/87
2004/0108989 A1* 6/2004 Gyouten .............. G09G 3/3677
345/100

(Continued)

FOREIGN PATENT DOCUMENTS

JP 2012-68980 4/2012

*Primary Examiner* — Ilana Spar
*Assistant Examiner* — Brent D Castiaux
(74) *Attorney, Agent, or Firm* — Oblon, McClelland, Maier & Neustadt, L.L.P.

(57) ABSTRACT

According to one embodiment, the touch drive device includes a plurality of drive electrodes arranged side by side to extend in a single direction, a detection electrode which extends in a direction crossing the direction in which the drive electrodes extend, and generates capacitances at intersections of the detection electrode and the drive electrodes, and a driver (DDI) which groups the drive electrodes into a plurality of drive electrode portions each including at least one drive electrode, and performs a touch scanning drive by supplying a touch drive signal (TSVCOM) having a pulse waveform for detection of a closely situated external object to a target drive electrode portion which is a selected one of the drive electrode portions. The number of the drive electrodes included in each of the drive electrode portions and the target drive electrode portion to which the touch drive signal (TSVCOM) is supplied can be designated.

10 Claims, 25 Drawing Sheets

(51) Int. Cl.
*G06F 3/044* (2006.01)
*G09G 3/36* (2006.01)
*G11C 19/28* (2006.01)

(52) U.S. Cl.
CPC ......... *G09G 3/3648* (2013.01); *G09G 3/3655* (2013.01); *G11C 19/28* (2013.01); *G09G 2310/0286* (2013.01)

(56) References Cited

U.S. PATENT DOCUMENTS

| | | | | |
|---|---|---|---|---|
| 2005/0179677 | A1* | 8/2005 | Nojiri | G09G 3/3614 345/204 |
| 2010/0188444 | A1* | 7/2010 | Okuyama | G09G 3/2025 345/691 |
| 2012/0075239 | A1* | 3/2012 | Azumi | G06F 3/044 345/174 |

* cited by examiner

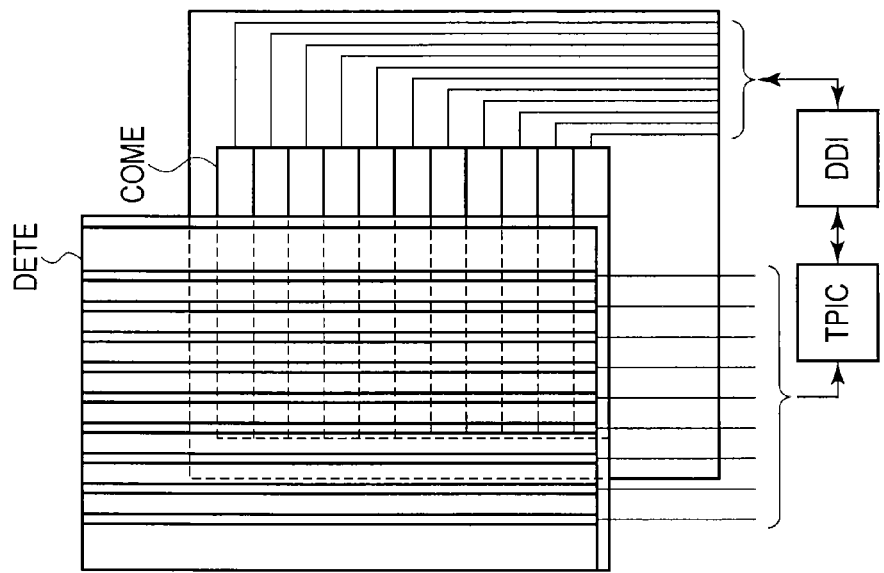
F I G. 4B
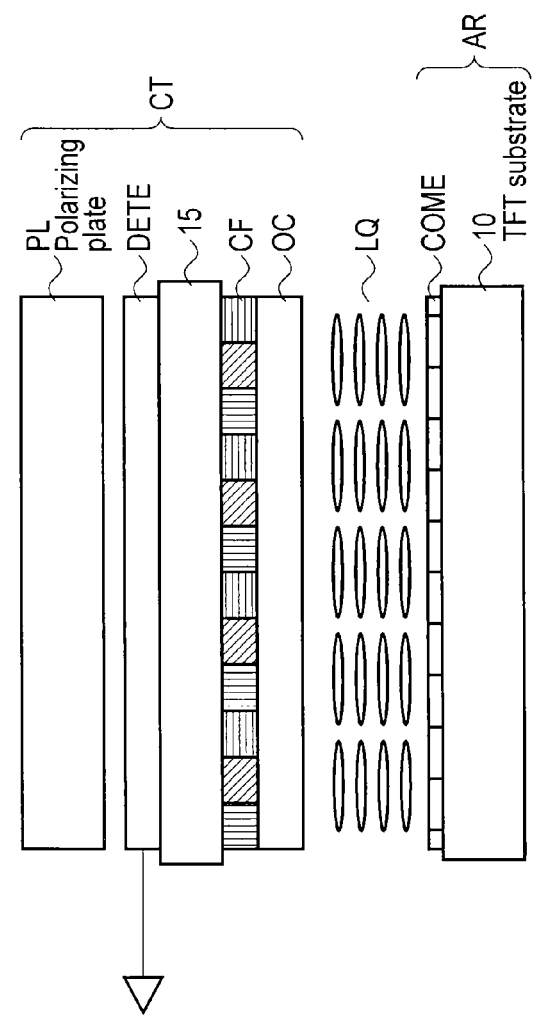
F I G. 4A

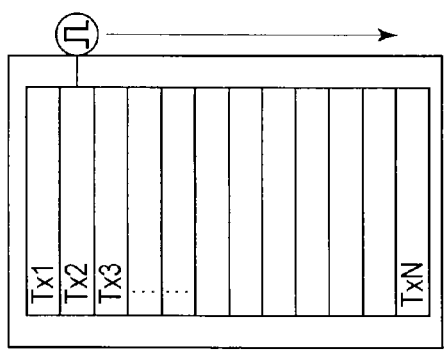
F I G. 5A
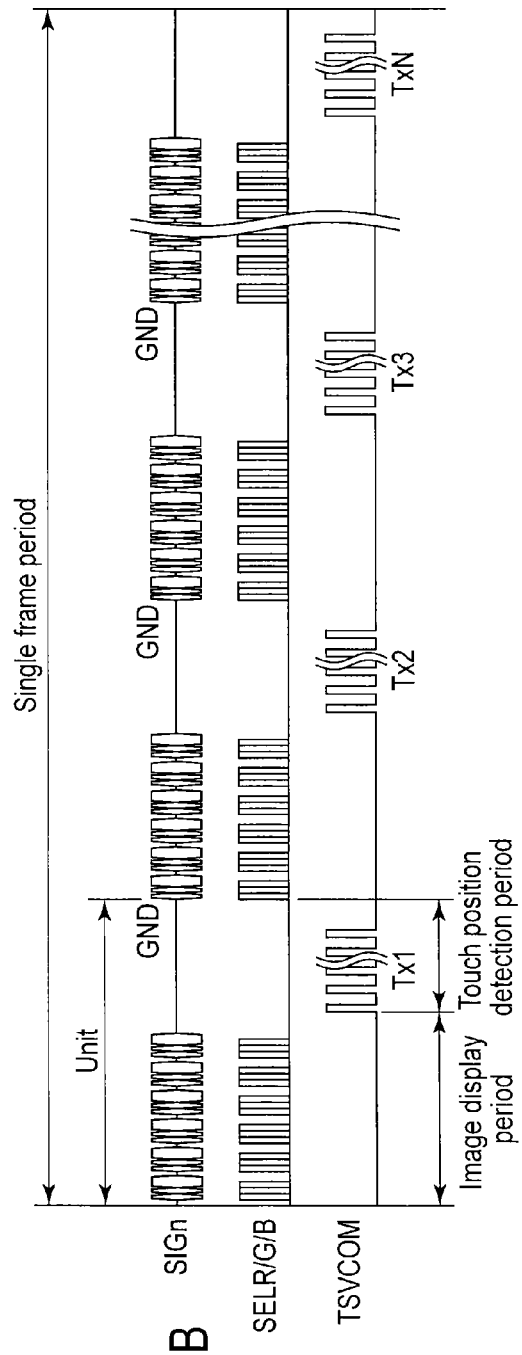
F I G. 5B

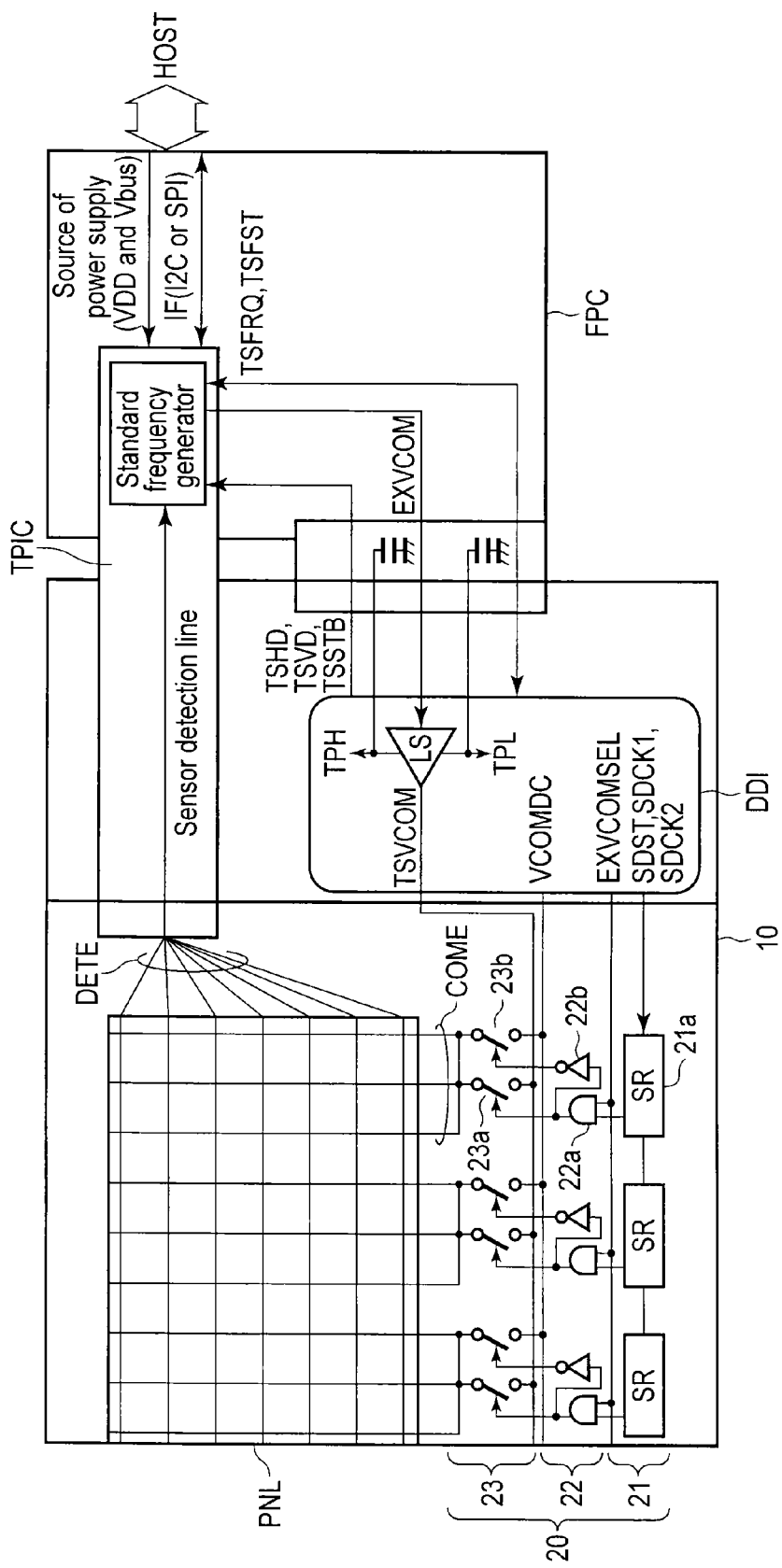
F I G. 6

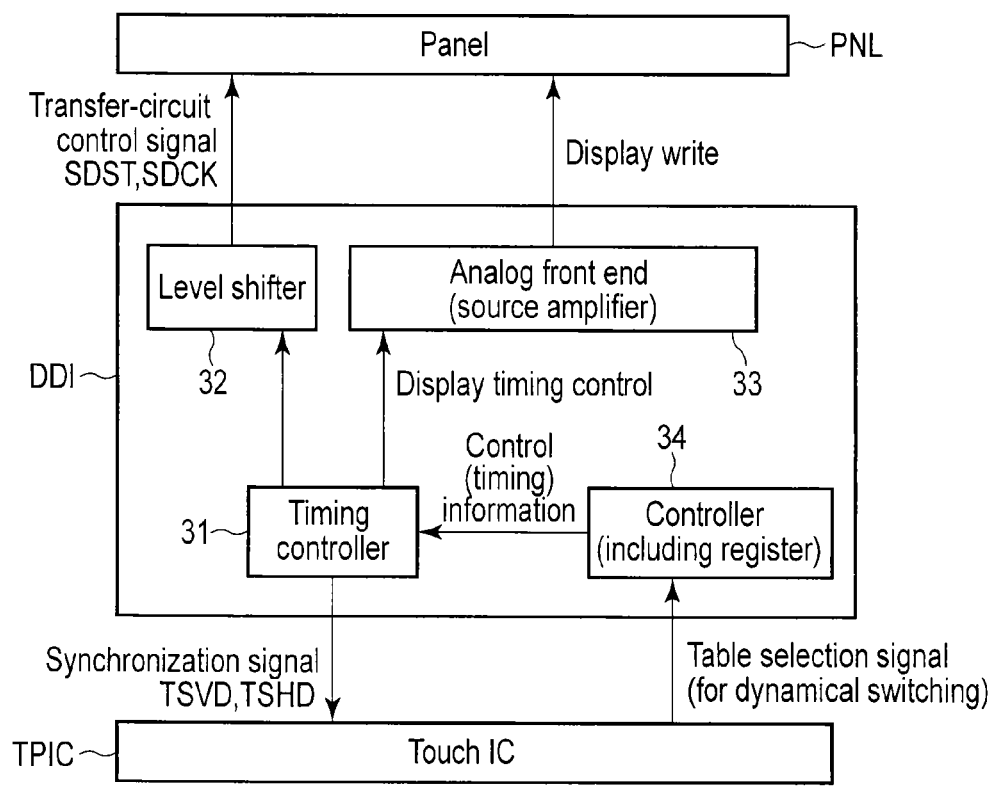
F I G. 7

Line_NUMBER_OF_UNIT=45
VALID_UNIT_NUM=41
LOOP_MAX_NUM=29

| | BP | Unit 0 | Unit 1 | ... | Unit 28 | Unit 29 | Unit 30 | Unit 31 | ... | Unit 40 | Unit 41 | Unit 42 | FP | BP | Unit 0 |
|---|---|---|---|---|---|---|---|---|---|---|---|---|---|---|---|
| LOOP_CNT | — | 0 | 1 | ... | 28 | 29 | 0 | 1 | ... | 10 | 11 | 11 | — | — | 12 |
| Start line | 1 | 5 | 50 | ... | 1265 | 1310 | 1355 | 1400 | ... | 1805 | 1850 | 1895 | 1925 | 1 | 5 |
| End line | 4 | 49 | 94 | ... | 1309 | 1354 | 1399 | 1444 | ... | 1849 | 1894 | 1924 | 1926 | 4 | 49 |
| Number of lines | 4 | 45 | 45 | ... | 45 | 45 | 45 | 45 | ... | 45 | 45 | 30 | 2 | 4 | 45 |

F I G. 15

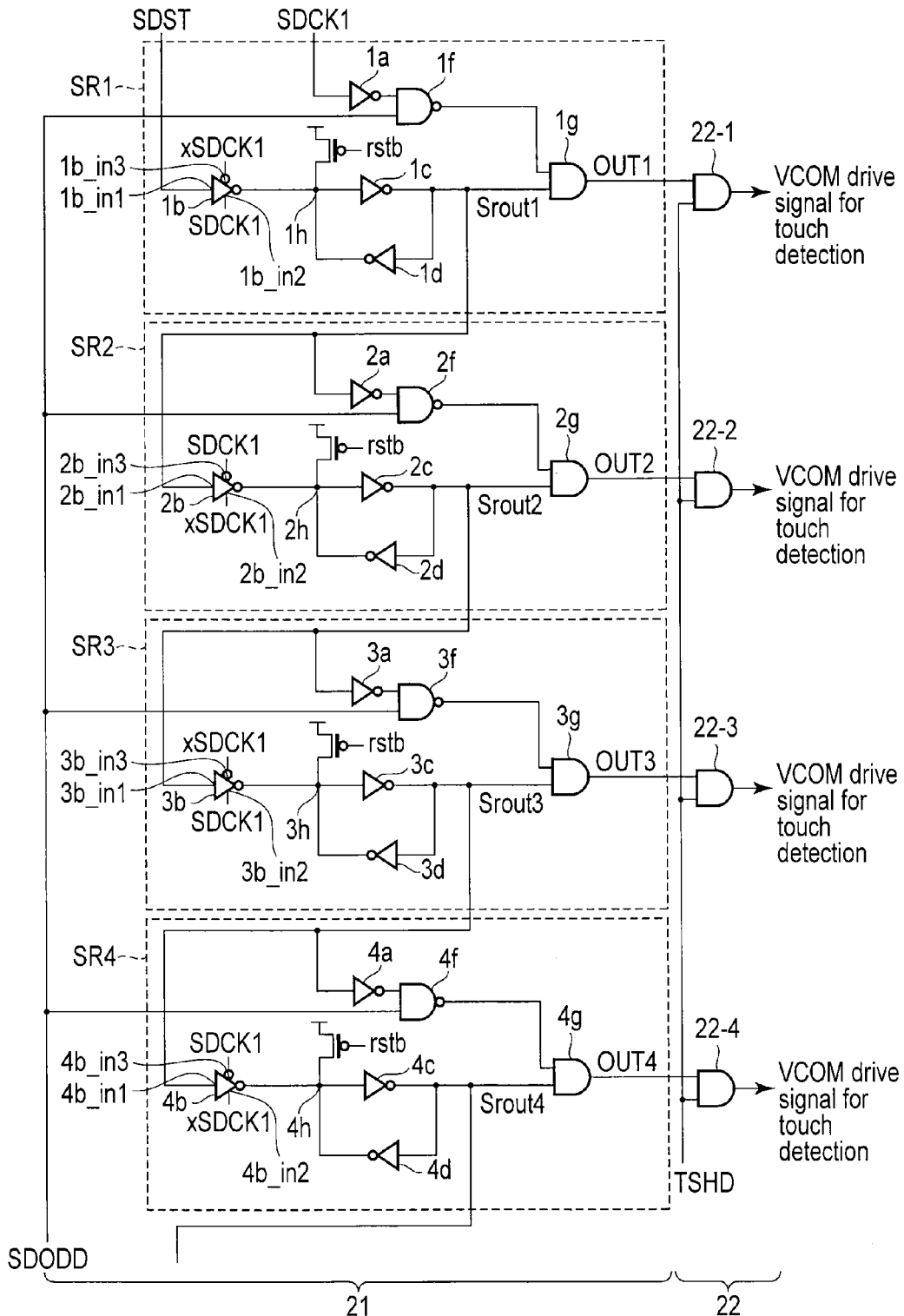
F I G. 16

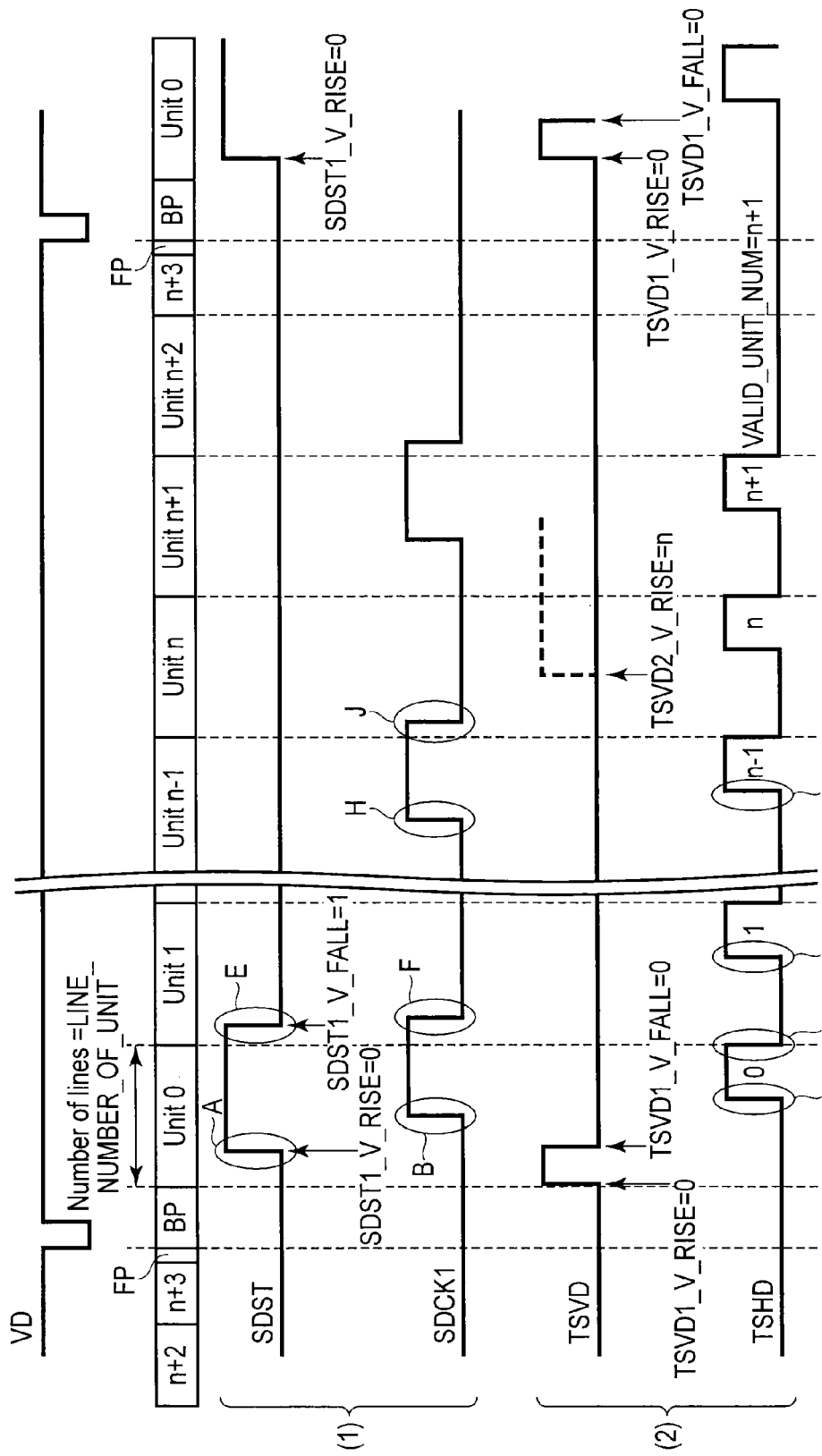
F I G. 17

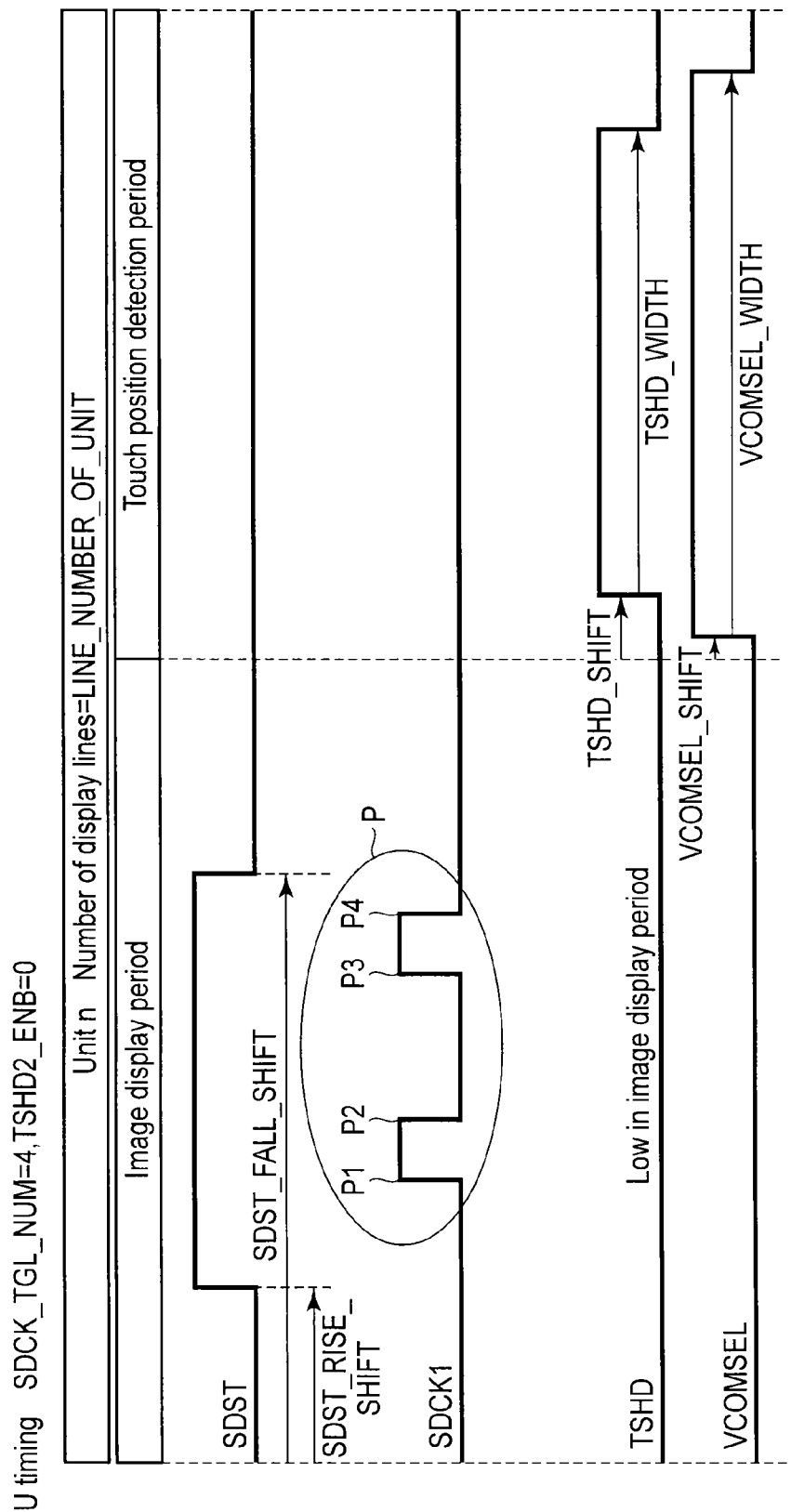
F I G. 19

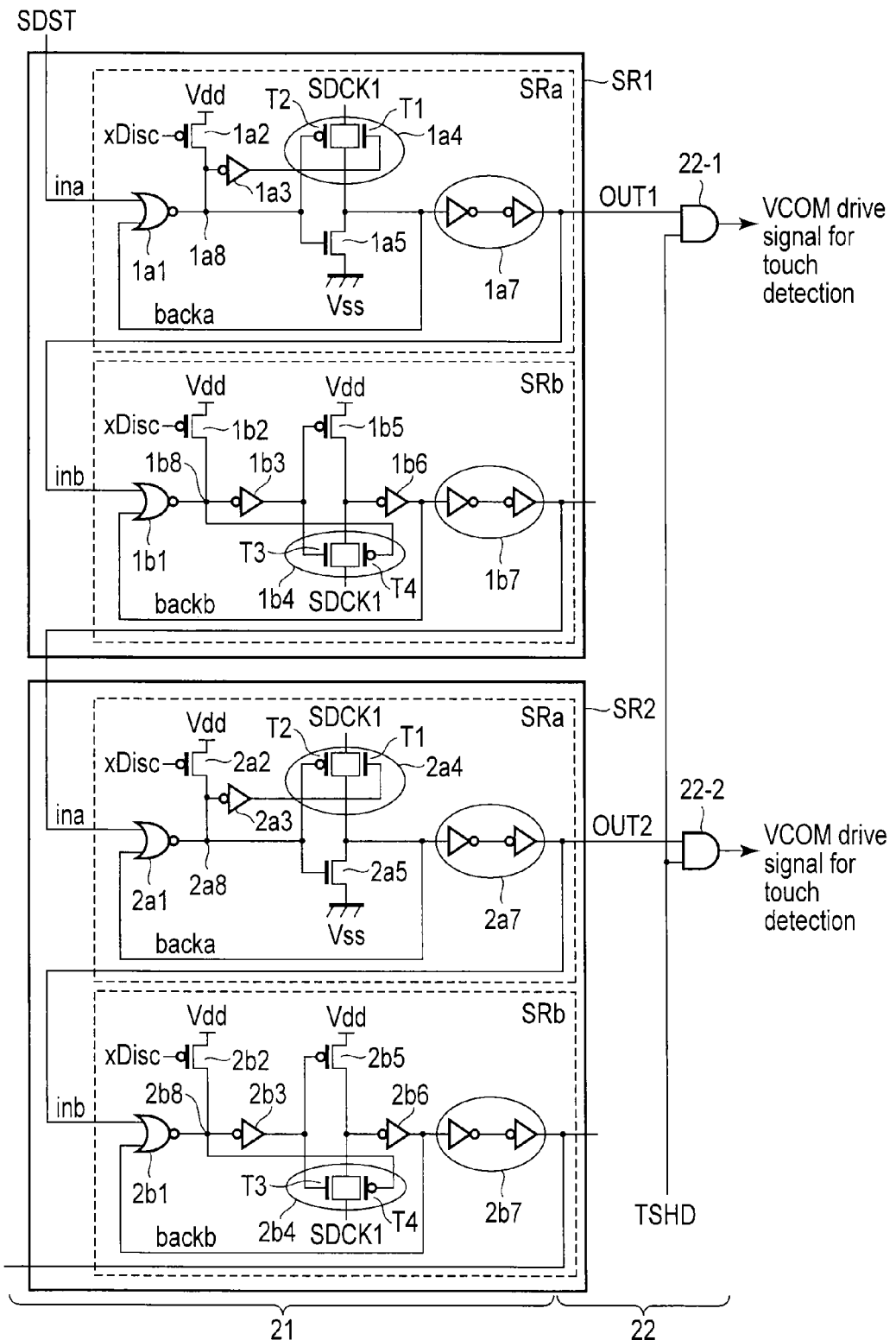
F I G. 22

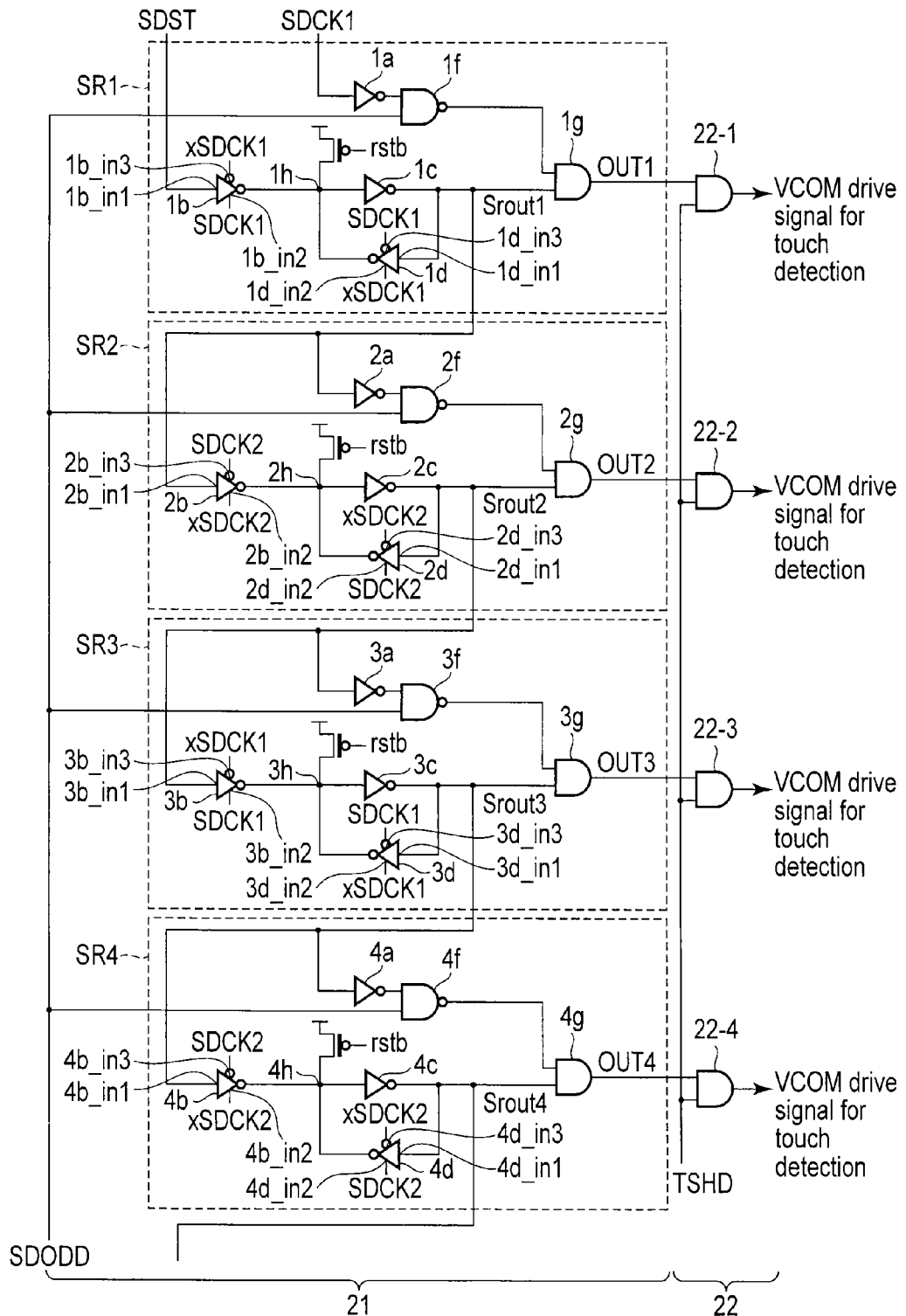
F I G. 24

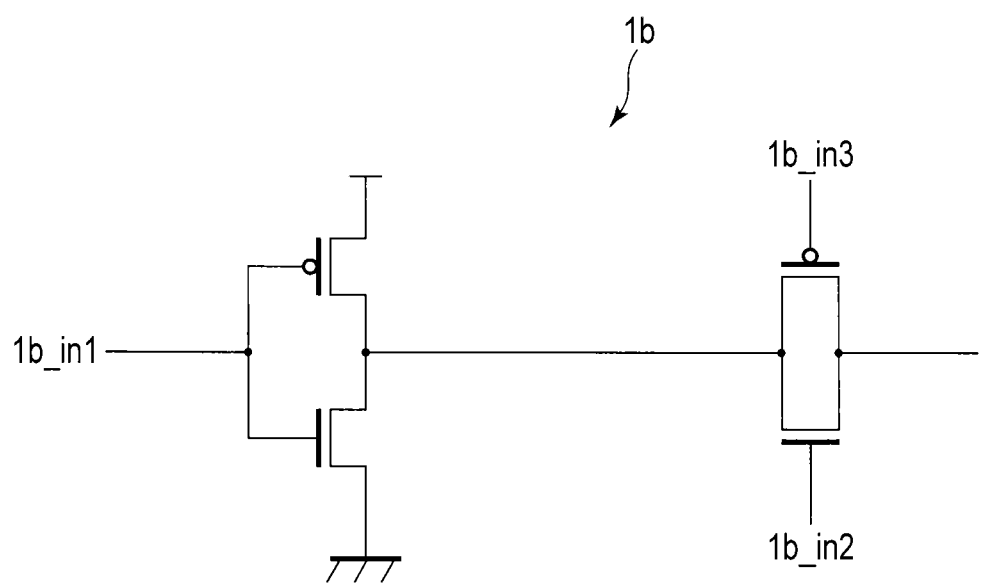
F I G. 25

TOUCH DRIVE DEVICE, TOUCH DETECTION DEVICE AND DISPLAY DEVICE HAVING TOUCH DETECTION FUNCTION

CROSS-REFERENCE TO RELATED APPLICATIONS

This application is based upon and claims the benefit of priority from Japanese Patent Applications No. 2014-071743, filed Mar. 31, 2014; and No. 2015-051133, filed Mar. 13, 2015, the entire contents of all of which are incorporated herein by reference.

FIELD

Embodiments described herein relate generally to a touch drive device, a touch detection device and a display device having a touch detection function.

BACKGROUND

In recent years, attention has been given to display devices in which a touch detection device referred to as a so-called touch panel is provided on a display device such as a liquid crystal display device, or a touch panel and a display device are integrated as a single body, and the display device is made to display various button images to enable information to be input without ordinary real buttons. Such display devices having a touch detection function do not need input devices such as a keyboard, a mouse and a keypad, and thus tend to be broadly used as display devices of computers, portable information terminals such as cell phones, etc.

As such a touch panel, a capacitive touch panel is known in which a plurality of electrodes each formed to extend in a single direction are intersected to each other. In this touch panel, the electrodes are connected to a control circuit, and when supplied with an excitation current from the control circuit, they detect an external object close thereto.

As a display device having touch detection function, a so-called in-cell touch panel is proposed in addition to a so-called on-cell touch panel in which a touch panel is provided on a display surface of a display device. In the in-cell display device, a common electrode for display, which is originally provided in the display device, is also used as one of a pair of electrodes for a touch sensor, and the other of the pair of electrodes (a touch detection electrode) is provided to intersect the common electrode.

Furthermore, a touch detection device is disclosed in which drive electrodes for touch sensor are successively selected in a time sharing manner such that a predetermined number of drive electrodes for touch sensor are selected at a time, and a touch detection signal is supplied to the selected drive electrodes for touch sensor, and scanning drive is performed such that a scanning pitch is smaller than a total width of the selected target drive electrodes (this scanning drive will be hereinafter referred to as "bundle drive").

It should be noted that since the above bundle drive needs to be synchronized with the display operation, in the touch detection device, a touch driver (TPIC) which controls a touch drive operation and a display driver (DDI) which controls a display operation perform a touch drive control in cooperation with each other. Thus, the display driver is configured to have a patterned touch drive control function.

However, in the case where identical display drivers are applied to various display panels, there is a case where the patterned touch drive control function needs to be changed in order to optimize a display operation and a touch drive operation.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

FIG. 4A is a view schematically showing a sensor of the display device having the touch detection function according to the first embodiment;

FIG. 4B is another view schematically showing the sensor of the display device having the touch detection function according to the first embodiment;

FIG. 5A is a view for explaining a drive method of the mutual detection method of the display device having the touch detection function according to the first embodiment;

FIG. 5B is another view for explaining the drive method of the mutual detection method of the display device having the touch detection function according to the first embodiment;

FIG. 6 is a view for explaining connections of drive signal lines in the mutual detection method of the display device having the touch detection function, according to the first embodiment;

FIG. 7 is a block diagram showing a configuration of a display driver in the display device having the touch detection function according to the first embodiment;

FIG. 15 is a view for explaining a driving method of a display operation and a touch drive operation of a display device having a touch detection function, according to a second embodiment;

FIG. 16 is a view showing in detail a configuration of a shift register circuit in a touch drive circuit in a display device having a touch detection function, according to a third embodiment;

FIG. 17 is a view for explaining an operation of the shift register circuit in the touch drive circuit in the display device having the touch detection function, according to the third embodiment;

FIG. 19 is a view for explaining another variation of the operation of the shift register circuit in the touch drive circuit in the display device having the touch detection function according to the third embodiment;

FIG. 22 is a view showing in detail a configuration of a shift register circuit in a touch drive circuit in a display device having a touch detection function, according to a fourth embodiment;

FIG. 24 is a view showing in detail a configuration of a shift register circuit in a touch drive circuit in a display device having a touch detection function, according to a fifth embodiment; and FIG. 25 is a view showing a configuration example of an inverter in the touch drive circuit in the display device having the touch detection function, according to the fifth embodiment.

DETAILED DESCRIPTION

Various embodiments will be described hereinafter with reference to the accompanying drawings.

In general, according to one embodiment, a touch drive device comprises: a plurality of drive electrodes arranged side by side to extend in a single direction, a detection electrode which extends in a direction crossing the direction in which the drive electrodes extend, and generates capacitances at intersections of the detection electrode and the drive electrodes; and a driver (DDI) which groups the drive electrodes into a plurality of drive electrode portions each including at least one drive electrode, and performs a touch scanning drive by supplying a touch drive signal (TSV-COM) having a pulse waveform for detection of a closely situated external object to a target drive electrode portion which is a selected one of the drive electrode portions. The number of the drive electrodes included in each of the drive electrode portions can be designated, and the target drive electrode portion to which the touch drive signal (TSV-COM) is supplied can also be designated.

First Embodiment

Figure 1:
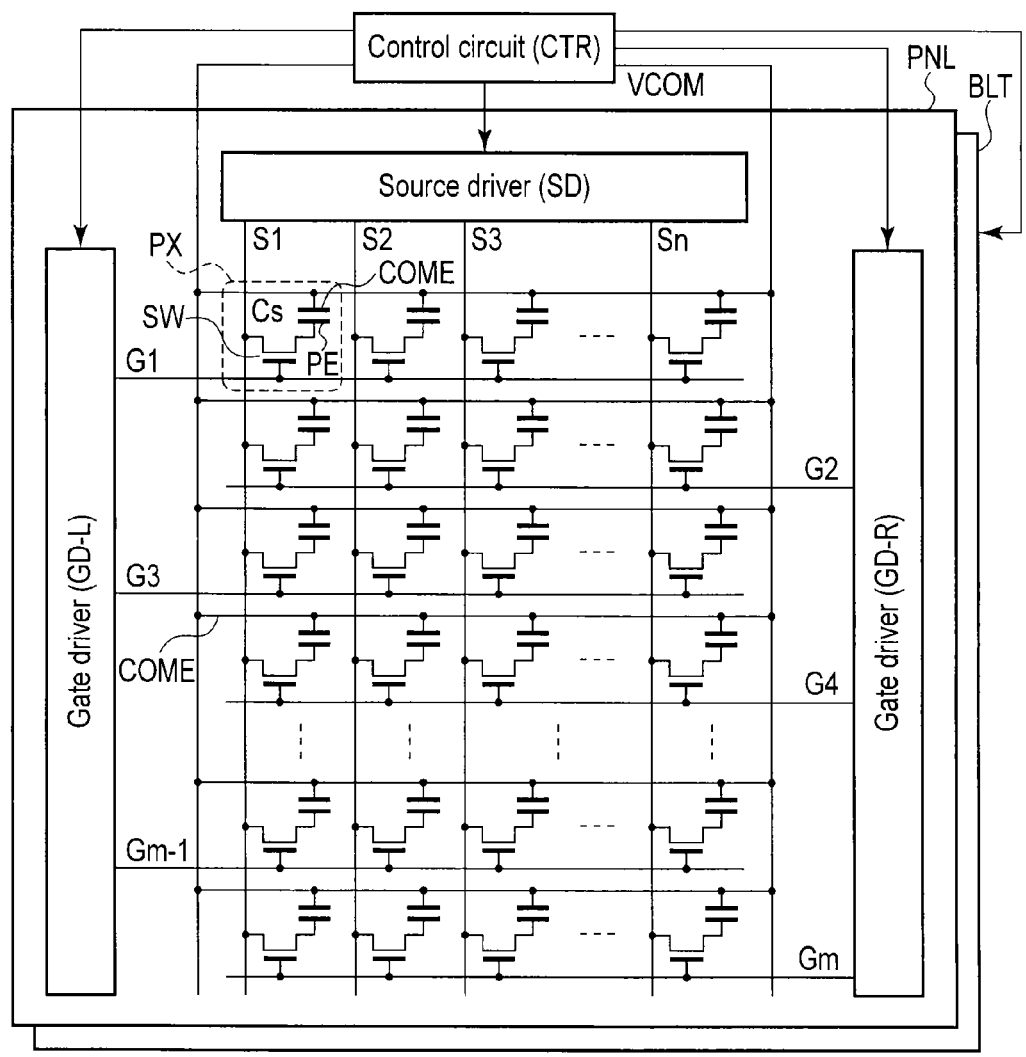
FIG. 1 is a view schematically showing a structure of a display device having a touch detection function, according to a first embodiment.

FIG. 1 is a view schematically showing a structure of a display device DSP having touch detection function, according to the first embodiment. It should be noted that in the first embodiment, the display device is a liquid crystal display device.

The display device comprises a display panel PNL and a backlight BLT which illuminates the display panel PNL from a rear surface side thereof.

The display panel PNL comprises a display portion including display pixels PX arranged in a matrix.

As shown in FIG. 1, the display portion comprises gate lines G (G1, G2, ... ), source lines S (S1, S2, ... ) and pixel switches SW, the gate lines G extending along display pixels PX arranged in a row direction, the source lines S extending along display pixels PX arranged in a column direction, and pixel switches PW arranged close to intersections of the gate lines G and the source lines S.

The pixel switches SW comprise thin film transistors (TFTs). Gate electrodes of the pixel switches SW are electrically connected to associated gate lines G. Source electrodes of the pixel switches SW are electrically connected to associated source lines S. Drain electrodes of the switches S are electrically connected to associated pixel electrodes PE.

Furthermore, as drive means for driving the display pixels PX, gate drivers GD (left GD-L and right GD-R) and a source driver SD are provided. The gate lines G are electrically connected to output terminals of the gate drivers GD. The source lines S are electrically connected to output terminals of the source driver SD.

The gate drivers GD and the source driver SD are located in a peripheral area (frame edge) of the display area. The gate drivers GD successively applies on-voltages to the gate lines G, as a result of which the on-voltages are applied to the gate electrodes of pixel switches SW, which are electrically connected to selected scanning lines GL. To be more specific, when an on-voltage is applied to a gate electrode, electrical conduction is effected between a source electrode and a drain electrode of a pixel switch SW. On the other hand, the source driver SD supplies output signals to the source lines S, respectively. To be more specific, when an output signal is supplied to a signal line S, it is also supplied to an associated pixel electrode PE through the pixel switch SW which is being switched on.

Operations of the gate drivers GD and the source driver SD are controlled by a control circuit CTR provided outside the liquid crystal display panel PNL. Furthermore, the control circuit CTR applies a common voltage Vcom to a common electrode COME which will be described later, and also controls an operation of the backlight BLT.

Figure 2:
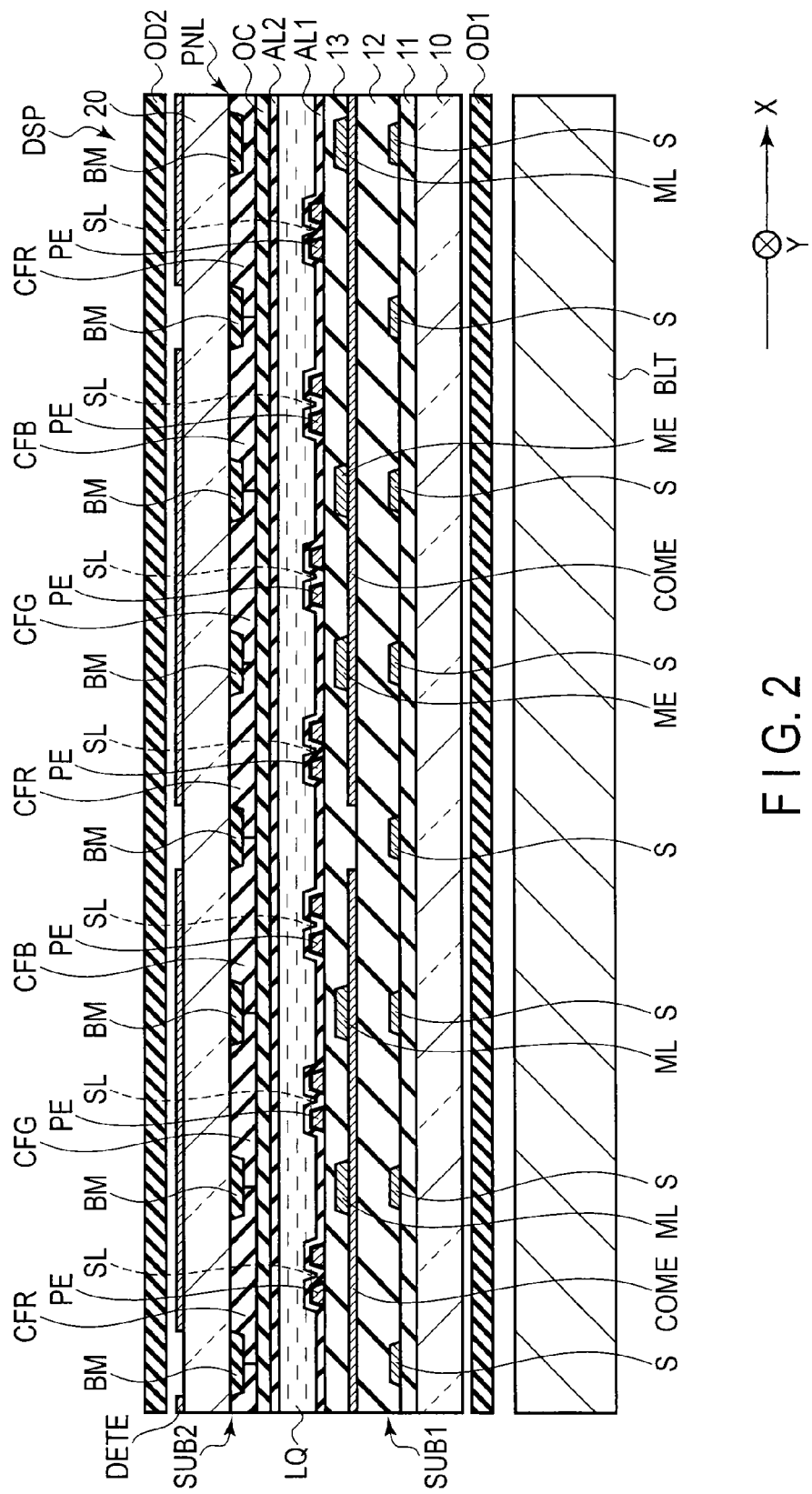
FIG. 2 is a cross-sectional view showing in more detail the display device having the touch detection function according to the first embodiment.

FIG. 2 is a cross-sectional view showing in more detail a structure of the display device DSP having touch detection function, according to the first embodiment.

The display device DSP having touch detection function comprises the display panel PNL, the backlight BLT, a first optical element OD1 and a second optical element OD2. In an example shown in the figure, the display panel PNL is a liquid crystal display panel; however, as the display panel PNL, another flat panel such as an organic electroluminescence display panel may be applied. Also, the display panel PNL as shown in the figure has a structure compliant with a lateral electric-field mode applied as a display mode, but may have a structure compliant with another display mode.

The display panel PNL comprises a first substrate SUB1, a second substrate SUB2 and a liquid crystal layer LQ. The first substrate SUB1 and the second substrate SUB2 are stacked together, with a gap provided between them. The liquid crystal layer LQ is held in the gap between the first substrate SUB1 and the second substrate SUB2.

The first substrate SUB1 is formed of a first insulating substrate 10 having a light transmittance characteristic, such as a glass substrate or a resin material. On a side of the first insulating substrate 10 which is located opposite to the second substrate SUB2, the first substrate SUB1 comprises the source lines S, the common electrode COME, the pixel electrodes PE, a first insulating film 11, a second insulating film 12, a third insulating film 13, a first alignment film AL1, etc.

The pixel electrodes PE and the common electrode COME form, along with a pixel area of the liquid crystal layer located between those electrodes, display pixels, which are arranged in the display panel PNL.

The first insulating film 11 is provided on the first insulating substrate 10. It should be noted that although it will not be explained in detail, between the first insulating substrate 10 and the first insulating film 11, the gate lines G, gate electrodes of switching elements, a semiconductor layer, etc., are provided. The source lines S are formed on the first insulating film 11. Also, drain electrodes and source electrodes of the switching elements, etc., are formed on the first insulating film 11. In the example shown in the figure, the source lines S extend parallel to the common electrode COME in a second direction Y.

The second insulating film 12 is provided on the source lines S and the first insulating film 11. The common electrode COME is formed on the second insulating film 12. In the example shown in the figure, the common electrode COME comprises a plurality of segments. The segments of the common electrode COME extend in the second direction Y, and spaced from each other in a first direction X. Such a common electrode COME is formed of a transparent conductive material such as indium tin oxide (ITO) or indium zinc oxide (IZO). It should be noted that in the example shown in the figure, although metal layers ML are formed on the common electrode COME to reduce the resistance of the common electrode COME, they may be omitted.

The third insulating film 13 is provided on the common electrode COME, the metal layers ML and the second insulating film 12. The pixel electrodes PE are formed above the third insulating film 13. Also, each of the pixel electrodes PE is located between associated adjacent two of the source lines S as viewed from above and opposite to the common electrode COME as viewed on-side. Furthermore, the pixel electrodes PE include slits SL located opposite to the common electrode COME. Such pixel electrodes PE are formed of transparent conductive material such as ITO or IZO. The first alignment film AL1 covers the pixel electrodes PE and the third insulating film 13.

On the other hand, the second substrate SUB2 is formed of a second insulating substrate 20 having a light transmission characteristic, such as a glass substrate or a resin substrate. On a side of the second insulating film 20 which is located opposite to the first substrate SUB1, the second substrate SUB2 comprises black matrixes BM, color filters CFR, CFG and CFB, an overcoat layer OC, a second alignment film AL2, etc.

The black matrixes BM are formed on an inner surface of the second insulating film 20, and partition pixels. Color filters CFR, CFG and CFB are also formed on the inner surface of the second insulating film 20, and partially stacked on the black matrixes BM. For example, the color filters CFR are red filters; the color filters CFG are green filters; and the color filters CFB are blue filters. The overcoat layer OC covers the color filters CFR, CFG and CFB. Also, the overcoat layer OC is formed of transparent resin material. The second alignment film AL2 covers the overcoat layer OC.

A detection electrode DETE is formed on an outer surface of the second insulating film 20. Also, the detection electrode DETE extends in a direction crossing the segments of the common electrode COME. In the example shown in the figure, the detection electrode DETE extends in the first direction X. The detection electrode DETE is formed of transparent conducive material such as ITO or IZO.

The backlight BLT is provided on a rear surface side of a display panel LPN. As the backlight BLT, various backlights can be applied, and for example, a backlight employing a light emitting diode (LED) or a cold-cathode fluorescent lamp (CCFL) as a light source can be applied. A detailed explanation of the structure of the backlight BLT will be omitted.

The first optical element OD1 is provided between the first insulating substrate 10 and the backlight BLT. The second optical element OD2 is provided above or on the detection electrode DETE. Each of the first optical element OD1 and the second optical element OD2 includes at least a polarizing plate, and may include a retardation plate as occasion demands.

Next, a touch sensor of the display device DSP having the touch detection function according to the first embodiment will be explained. As a method of detecting that the user's finger or a pen touches a touch panel or is close to the touch panel, a principle of a mutual detection method will be explained.

Figure 3:
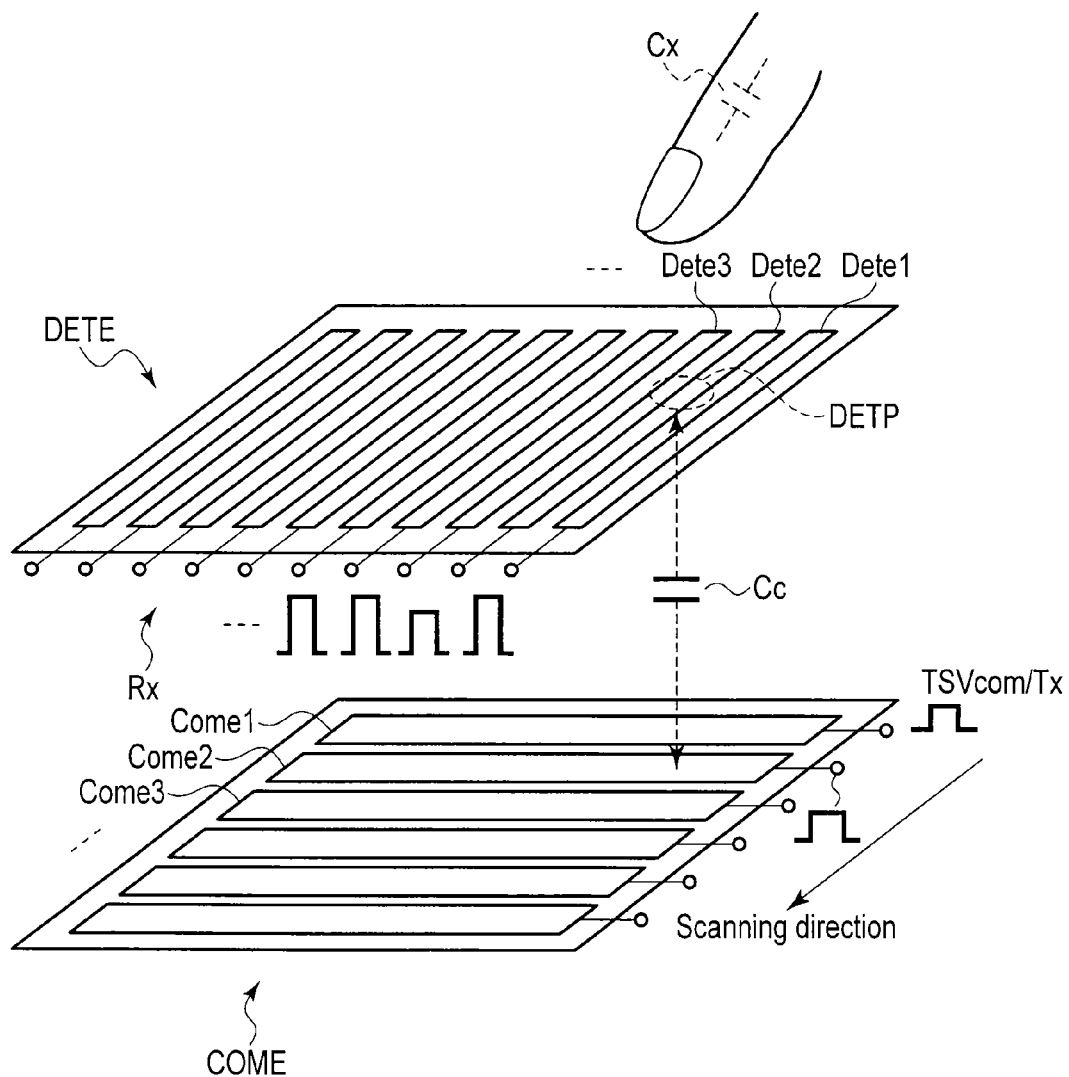
FIG. 3 is a view showing a representative basic structure of a mutual detection method of the display device having the touch detection function according to the first embodiment.

FIG. 3 is a view showing a representative basic structure of a mutual detection type of display device DSP having touch detection function according to the first embodiment. The common electrode COME and the detection electrode DETE are used. The common electrode COME includes a plurality of common electrodes Come1, Come2, Come3, . . . arranged in the manner of stripes. The common electrodes Come1, Come2, Come3, . . . are also arranged in a scanning (driving) direction (a Y direction or an X direction).

The detection electrode DETE includes a plurality of detection electrodes Dete1, Dete2, Dete3, . . . arranged in the manner of stripes (which are thinner than the common electrodes arranged in the manner of stripes). The detection electrodes Dete1, Dete2, Dete3 . . . are also arranged in a direction (the X direction or the Y direction) crossing the common electrodes Come1, Come2, Come3, . . . .

The common electrodes Come1, Come2, Come3, . . . arranged in the manner of stripes in the common electrode COME and detection electrodes Dete1, Dete2, Dete3, . . . arranged in the manner of stripes in the detection electrode DETE are spaced from each other. Thus, basically, capacitors Cc are present between the common electrodes Come1, Come2, Come3, . . . and the detection electrodes Dete1, Dete2, Dete3, . . . .

The common electrodes Come1, Come2, Come3, . . . are scanned by drive pulses Tx at predetermined intervals. In the case where the user's finger is close to the detection electrode Dete2 when drive pulses are supplied to the common electrode Come2, amplitudes of the detection pulses obtained from the detection electrode Dete 2 are lower in level than those of the pulses obtained from the other detection electrodes arranged in the manner of stripes. This is because a capacitor Cx is generated in the finger, and added to the capacitance Cc. In the mutual detection method, the above obtained pulse having a low detection level can be handled as a detection pulse for a position DETP.

The above capacitance Cx varies in accordance with whether the finger is close to or far from the detection electrode DETE. Thus, the level of the detection pulse also varies in accordance with whether the user's finger is close to or far from the detection electrode DETE. It is therefore possible to determine from the level of the detection pulse how close the finger is to the flat surface of the touch panel. Needless to say, a two-dimensional position of the finger on the flat surface of the touch panel can be detected based on an electrode driving timing of the pulses Tx and output timing of the detection pulses.

FIGS. 4A and 4B are views schematically showing the structure of the display device DSP having touch detection function, according to the first embodiment. FIG. 4A is a cross-sectional view of the display device DSP having touch detection function, and FIG. 4B is a plan view showing the structure of the sensor.

As shown in FIG. 4A, the display device DSP having touch detection function comprises an array substrate AR, a counter-substrate CT and the liquid crystal layer LQ held between the array substrate AR and the counter-substrate CT.

In the following explanation, in order to simplify it, the common electrodes Come1, Come2, Come3, . . . arranged in the manner of stripes are referred to as common electrodes COME, and the detection electrodes Dete1, Dete2, Dete3, . . . are referred to as detection electrodes DETE.

The array substrate AR comprises a TFT substrate 10 and the common electrodes COME. The TFT substrate 10 comprises a transparent insulating substrate formed of glass or the like, switching elements not shown, various lines including source lines, gate lines, etc., and a flattening layer which is an insulating film covering those lines. The common electrodes COME are provided on the TFT substrate 10 and covered by an insulating layer. The common electrodes COME, for example, extend in the first direction, and are arranged in the manner of stripes in the second direction crossing the first direction. The common electrodes COME are formed of transparent electrode material such as indium tin oxide (ITO) or indium zinc oxide (IZO). In the first embodiment, the common electrodes COME are also used as drive electrodes for the sensor.

The counter-substrate CT comprises a transparent insulating substrate 20 such as glass, color filters CF, the detection electrode DETE and a polarizing plate PL. The color filters CF are provided on the transparent insulating substrate 20. The color filters CF are covered by the overcoat layer OC. The detection electrode DETE is provided on a main outer surface of the transparent insulating substrate 20 (which is located opposite to the color filters CF). The detection electrodes DETE extend in a direction (second direction) crossing an extending direction (first direction) of the common electrodes, and are arranged in the manner of stripes in the first direction. The detection electrodes DETE are formed of transparent electrode material such as ITO or IZO. The polarizing plate PL is provided above or on the detection electrode DETE (on a side of the transparent insulating substrate 20 which is located opposite to the color filters CF).

FIG. 4B is a view for explaining a configuration example of the above common electrodes COME and the detection electrodes DETE. In the display device DSP having the touch detection function according to the first embodiment, a touch driver TPIC and a display driver DDI operate in cooperation with each other, whereby drive pulses TSV-COM are input to the common electrodes COME, and a detection pulses are obtained from the detection electrodes DETE. The display driver DDI outputs the drive pulses TSVCOM, and the touch driver TPIC recognizes a touch position of the finger from the waveform of the detection pulses and the position of a common electrode COME to which the drive pulses TSVCOM are input. It should be noted that the structure may be made such that calculation of the touch position is performed by an external device not shown. A signal output from the display driver DDI and signal transmission between the display driver DDI and the touch driver TPIC will be explained in detail later.

FIGS. 5A and 5B are views for explaining a driving method of the mutual detection method of the display device DSP having the touch detection function, according to the first embodiment.

FIG. 5A shows drive units Tx of the common electrodes COME. Drive units Tx1, . . . TxN are formed of the common electrodes COME, respectively, which are successively arranged in the manner of stripes. As described above, the common electrodes COME for use in displaying an image are also used as drive electrodes for touch position detection. Thus, an image display operation and a touch position detection operation are performed in a time sharing manner.

In a driving method as shown in FIG. 5B, a single frame period comprises a plurality of units. A single unit is divided into image display periods in each of which an image is displayed and touch position detection periods in each of which a touch position is detected. In the single frame period, the image display periods and the touch position detection periods are alternately repeated. To be more specific, an operation for outputting an image signal (SIGn) corresponding to a color in response to a signal (SELR/G/B) for selecting any of three colors of RGB is performed on each of a plurality of display lines, and thereafter a mutual detection operation is performed in which the drive pulses TSVCOM are input to the drive units Tx (the common electrodes COME arranged in the manner of stripes). Then, the plurality of display lines and the drive units Tx (Tx1, . . . TxN) are successively subjected to the above operations. It should be noted that the display operation and touch drive operation may be controlled in synchronism with each other such that the display lines and lines of the drive units Tx are made to conform to each other, or may be controlled independent of each other.

FIG. 6 is a view for explaining connections of drive signal lines in the mutual detection method of the display device DSP having the touch detection function, according to the first embodiment. FIG. 6 shows a two-chip system comprising two IC chips, i.e., a touch driver (TPIC) and a display driver (DDI). In this system, the touch driver TPIC and the display driver DDI performs the touch drive operation and the display operation in synchronism with each other.

In a TFT substrate 10, the display driver DDI is provided. Also, in the TFT substrate 10, a touch drive circuit 20 including shift registers SR are provided. A drive signal output from the display driver DDI supplies drive pulses TSVCOM to the common electrodes COME through the touch drive circuit 20. In a counter-substrate CT, the detection electrodes DETE are provided, and sensor detection lines from the detection electrodes DETE are electrically connected to the touch driver TPIC through electrodes for external extension.

The touch driver TPIC is connected to an external host processing unit HOST, with a flexible print circuit (FPC) interposed between them. It should be noted that information is transmitted between the touch driver TPIC and the host processing unit HOST by a communication method such as Inter-Integrated Circuit (I2C) or Serial Peripheral Interface (SPI). Furthermore, to the touch driver TPIC, power (VDD, Vbus) is supplied from the outside.

Next, data transmission between the touch driver TPIC and the display driver DDI will be explained.

The display driver DDI outputs a signal for synchronization to the touch driver TPIC. The signal for synchronization includes a vertical synchronizing signal TSVD and a horizontal synchronizing signal TSHD. The vertical synchronizing signal TSVD is a synchronizing signal indicating a start of a frame. The horizontal synchronizing signal TSHD is a synchronizing signal associated with an operation for each of lines in a frame. The touch driver TPIC outputs a drive synchronizing signal EXVCOM, which accurately synchronizes with a sampling timing for touch detection, to the display driver DDI in synchronism with the horizontal synchronizing signal TSHD. The display driver DDI outputs drive pulses TSVCOM, in which the drive synchronizing signal EXVCOM is level-shifted in voltage level and converted in impedance, to the touch drive circuit 20.

The touch drive circuit 20 comprises a shift register circuit 21, a selection circuit 22 and a switching circuit 23. A structure and an operation of the touch drive circuit 20 will be explained by referring to a single shift register 21a and a circuit connected thereto as an example.

To the shift register 21a, a transfer start pulse SDST and transfer clock SDCK 1 are input as transfer-circuit control signals. It is noted that 2 clocks SDCK1 and SDCK2 may be used according to the specification. Shift registers at respective stages are successively supplied with a transfer start pulse SDST using the transfer clock SDCK1 and, and then the transfer start pulse SDST is output from the shift registers. It should be noted that the above shift register uses single transfer clock, i.e., the transfer clocks SDCK 1; however, a shift register adopting a method in which a start pulse is transferred using two transfer clocks SDCK 1 and SDCK 2 may be applied.

An output terminal of the shift register 21a is connected to one of input terminals of an AND circuit 22a included in the selection circuit 22. To the other input terminal of the AND circuit 22a, a drive synchronization selection signal EXVCOMSEL is input. The drive synchronization selection signal EXVCOMSEL is a signal which is set to "1" in the touch position detection period, and also set to "0" in the image display period. Thus, in the touch position detection period, and also in a period in which the output of the shift register 21a is "1", the output of the AND circuit 22a is "1", and the state of a touch switch 23a provided in the switching circuit 23 is switched to a connected state (on state). On the other hand, in the image display period, the output of the AND circuit 22a is "0". The output of the AND circuit 22a is set to "1" by an inverter 22b included in the selection circuit 22. The state of a display switch 23b included in the switching circuit 23 is switched to the connected state (on state).

Therefore, with respect to the touch position detection period, in a period in which the output of the above single shift register 21a is "1", the drive pulses TSVCOM are input to the common electrode COME through the touch switch 23a. On the other hand, in a period in which the output of the above single shift register 21a is "0", a direct-current signal VCOMDC is input to the common electrodes COME through the touch switch 23a. In the image display period, through the display switch 23b, the direct-current signal VCOMDC is input to the common electrode COME.

It should be noted that one of ends of the touch switch 23a, which is located close to the panel PNL, is connected to at least one of the common electrodes COME arranged in the manner of stripes. It is possible to obtain a detection signal with a favorable signal to noise ratio by inputting the drive pulses TSVCOM, which are pulse string, to the above at least one of the common electrodes COME. The number of common electrodes COME arranged in the manner of stripes, which are connected to the above end of the touch switch 23a on the panel PNL side, is not limited to a fixed number, and may be variable as described later.

Furthermore, in the touch position detection period, a touch drive operation is performed not only on the above at least one of the common electrodes COME arranged in the manner of stripes, which is connected to the output of the above single shift register, but on a plurality of common electrodes COME included in the common electrodes COME arranged in the manner of stripes, which are connected to a plurality of shift registers. This will be described in detail later.

It should be noted that in the touch driver TPIC, a standard-frequency generator is provided independently. Therefore, a drive frequency for touch drive can be set to an arbitrary value independent of that for display.

As explained above, the touch drive operation is performed while the touch driver TPIC and the display driver DDI are synchronizing with each other. In this case, the number of display lines in a single image display period (the number of a bundle of display lines), an output timing of each of the horizontal synchronizing signal TSHD and the vertical synchronizing signal TSVD, and an output timing of each of the transfer start pulse SDST and the transfer clock SDCK 1 are variable. To be more specific, in the display driver DDI, a plurality of constant tables which specify the number of the above bundle display lines, the output timing of each of drive signals (pulses), etc., are stored. The touch driver TPIC designates any of the constant tables, and the display driver DDI outputs a touch drive signal in accordance with data specified by the constant table designated by the touch driver TPIC.

It should be noted that the display driver DDI, the touch drive circuit 20, the common electrodes COME and the detection electrodes DETE as shown in FIG. 6 form a touch drive device. Furthermore, the touch drive device and the touch driver TPIC form a touch detection device. The touch detection device and the display panel PNL form the display device DSP having the touch detection function.

FIG. 7 is a block diagram showing a configuration of the display driver DDI of the display device DSP having the touch detection function according to the first embodiment. The display driver DDI comprises a timing controller 31, a level shifter 32, an analog front end 33 and a controller 34.

The touch driver TPIC outputs a constant-table selection signal designating a constant table to the display driver DDI. The constant-table selection signal is output in the case of dynamically switching the touch drive operation during the operation of the touch driver TPIC. The controller 34 sets data described in the designated constant table in a register included in the controller 34. The timing controller 31 outputs a drive signal in accordance with a value set in the register.

The timing controller 31 outputs the horizontal synchronizing signal TSHD and the vertical synchronizing signal TSVD to the touch driver TPIC. The timing controller 31 outputs the transfer start pulse SDST and the transfer clocks SDCK 1 to the panel PNL through the level shifter 32. Also, the timing controller 31 outputs a signal for controlling a display timing. The analog front end 33 outputs an image signal to the panel PNL in accordance with the control signal.

Then, an example of the timing of setting the touch drive signal will be explained.

Figure 8:
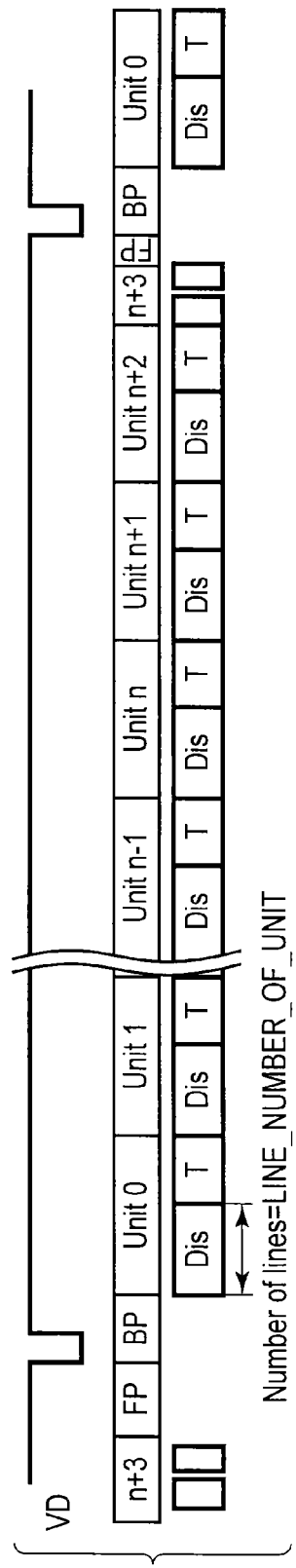
FIG. 8A is a view for explaining a drive method of a display operation and a touch drive operation in the case of designating the number of a bundle of display lines in the display device having the touch detection function according to the first embodiment.
FIG. 8B is another view for explaining the drive method of the display operation and the touch drive operation in the case of designating the number of a bundle of display lines in the display device having the touch detection function according to the first embodiment.

FIGS. 8A and 8B are views for explaining the display operation and the touch drive operation of the display device DSP having the touch detection function according to the first embodiment, in the case of designating the number of a bundle of display lines. FIG. 8A shows drive periods of the display operation and the touch drive operation in the case of designating the number of a bundle display lines, and FIG. 8B shows a concrete example with respect to the drive periods.

Referring to FIG. 8A, if a vertical drive signal VD for display is input, a predetermined number of lines in a back porch BP are driven. Then, the display operation and the touch drive operation are performed; and in this case, if a value (N) is designated in a register which indicates the number of a bundle of display lines (LINE_NUMBER_OF_UNIT), the touch drive operation is performed on N display lines after the display operation for N lines is performed. Then, this series of operations are repeatedly performed. These operations end when they are performed on a maximum number of display lines. Therefore, since the number of remaining display lines (reminder for mod N) is set in a last unit, the number of display lines in the last unit is equal to or less than N. Then, after a predetermined number of display lines in a front porch FP are driven, the above operations are repeatedly performed in synchronism with inputting of a new vertical drive signal VD.

FIG. 8B shows a configuration of each of units in the case where the number of a bundle of display lines (LINE_NUMBER_OF_UNIT) is set to 45 with respect to each unit. In this example, 4 display lines are set for a front porch, 2 display lines are set for a back porch, and the number of a bundle of display lines is 45. Thus, the number of active display lines is 1920, which is the number of display lines for units 0-41; and for unit 42, 30 (=1920−45×42) display lines are set as a fraction. It should be noted that for each of the front porch FP and the back porch BP, the number of display lines is determined based on specifications of the panel.

In the example as shown in FIGS. 8A and 8B, the number of lines which are driven in the display operation is equal to that in the touch drive operation. Therefore, the number of lines to be driven can be managed in common in the display operation and the touch drive operation.

Figure 9:
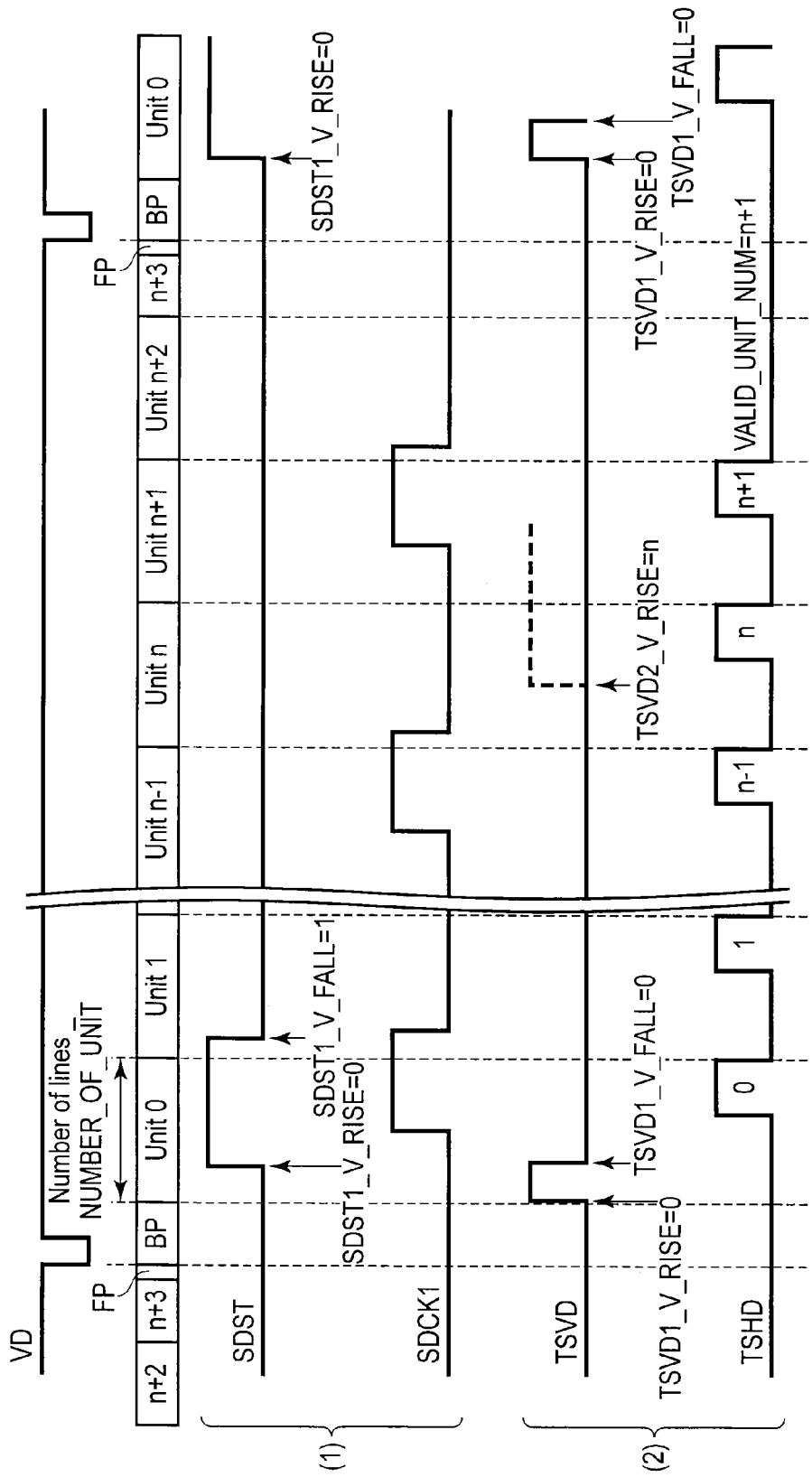
FIG. 9 is a view showing an example of an output timing of a drive signal of a display driver of the display device having the touch detection function according to the first embodiment.

FIG. 9 is a view showing an example of an output timing of a drive signal from the display driver DDI in the display device DSP having the touch detection function, according to the first embodiment. In FIG. 9, Units, front porch FP and back porch BP are the same as those in FIG. 8. In FIG. 9, (1) shows a signal for the shift register circuit 21 in the touch drive circuit 20, and (2) shows a synchronizing signal to be output to the touch driver TPIC. It should be noted that in FIG. 9, units 0 to (n+3) are specified. The unit (n+3) is a dummy unit.

FIG. 9, (1), shows the timings of the transfer start pulse SDST and a transfer clock SDCK1. The number of clock signals is not limited to one; that is, a plurality of clock signals may be used as the transfer clock. The transfer start pulse SDST is a signal which is output at the start of a single frame. The number of drive electrodes for sensor (common electrodes COME) and a location are selected at H level of the transfer start pulse SDST. And a location is selected at L level of the transfer start pulse SDST.

For example, at H level of the transfer start pulse SDST, the number of electrodes for sensor (common electrode or electrodes COME) is selected which is equal to the number of times the transfer clock SDCK1 varies. The drive electrode or electrodes for sensor are offset relative to a previously selected drive electrode or electrodes for sensor in a driving direction by the number of times the transfer clock SDCK1 varies. On the other hand, at L level of the transfer start pulse SDST, the number of electrodes for sensor selected is maintained. The drive electrode or electrodes for sensor are offset relative to a previously selected drive electrode or electrodes for sensor in the driving direction by the number of times the transfer clock SDCK1 varies.

However, the transfer start pulse SDST can also be generated a number of times in a single frame. The rising timing and falling timing of the transfer start pulse SDST are specified by setting unit numbers in registers indicating a rise (SDST1_V_RISE) and a fall (SDST1_V_FALL), respectively. In an example as shown in FIG. 9, (1), a rise is set in unit 0, and a fall is set in unit 1. Thus, a drive electrode or electrodes for sensor (common electrodes COME), the number of which is equal to the total number of rises and falls, are selected. The drive electrode or electrodes for sensor are offset relative to previously selected ones in the driving direction by the total number of rises and falls. Although in the above example, both the rises and falls are set, either rises or falls may be set.

The transfer clock SDCK1 is a pulse string generated in accordance with a start of a single frame. Therefore, neither a rising unit nor a falling unit needs to be specified.

Figure 10:
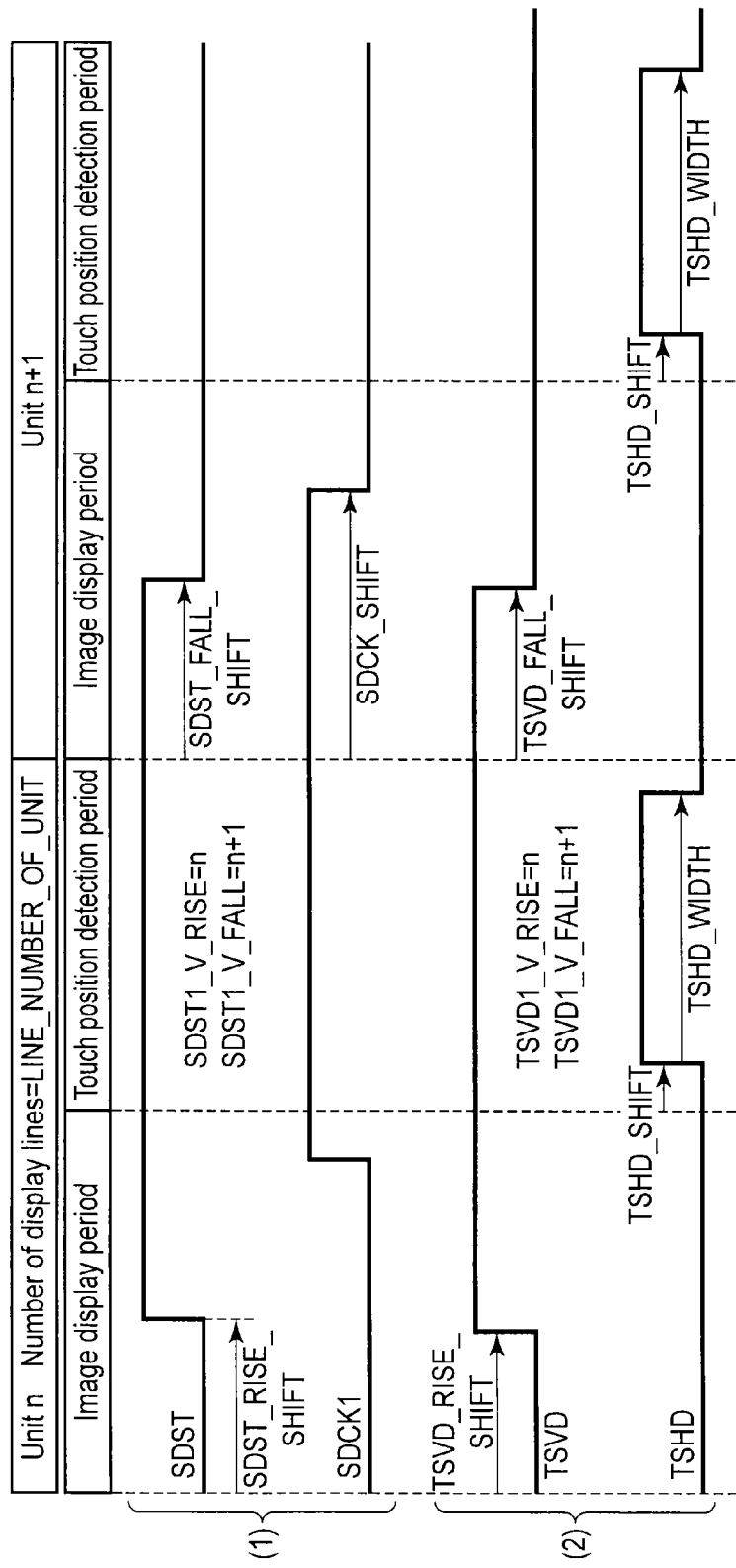
FIG. 10 is a view showing in detail another example of the output timing of the drive signal of the display driver in the display device having the touch detection function according to the first embodiment.

FIG. 10 is a view showing in detail an example of the output timing of a drive signal of the display driver DDI in the display device DSP having the touch detection function, according to the first embodiment. In FIG. 10, (1) shows a signal for driving the shift register circuit 21 in the touch drive circuit 20, and (2) shows a synchronizing signal to be output to the touch driver TPIC.

Referring to FIG. 10, (1), a rise and a fall of the transfer start pulse SDST are set in unit n and unit n+1, respectively. Also, the rising timing is time at which time set in a register (SDST_RISE_SHIFT) elapses from the start of unit n. The falling timing is time at which time set in a register (SDST_FALL_SHIFT) elapses from the start of unit n+1.

The transfer clock SDCK1 falls when time set in (SDCK_SHIFT) elapses from the start of a falling unit.

It should be noted that in unit n, since the transfer clock SDCK1 varies (rises) only once in an H period in which the transfer start pulse STST is kept at rise H in the image display period, the number of drive electrodes for sensor (common electrodes COME) to be selected is one, and a drive electrode for sensor (common electrode COME) which is offset relative to a previously selected drive electrode for sensor (common electrode COME) by one drive electrode in the driving direction is selected.

In an image display period of unit n+1, since the transfer clock SDCK1 varies (falls) only once in an L period in which the transfer start pulse SDST is kept at fall L, the number of drive electrodes for sensor (common electrodes COME) to be selected is maintained, i.e., it is one, and a drive electrode for sensor (common electrode COME) which is offset relative to the above selected drive electrode for sensor (common electrode COME) by one drive electrode in the driving direction is selected. This selected drive electrode for sensor (common electrode COME) is driven in a touch position detection period subsequent to the image display period.

It should be noted that the rising and falling timings of the transfer clock SDCK1 are set in registers as times at which times from the starts of units elapse, respectively.

Referring to FIG. 9, (2), the vertical synchronizing signal TSVD is a signal which is output at the start time of a single frame. However, there is a case where the vertical synchronizing signal TSVD is output a number of times in the single frame. The rising timing and falling timing of the vertical synchronizing signal TSVD are specified by setting unit numbers in registers indicating a rise (TSVD1_V_RISE) and a fall (TSVD1_V_FALL), respectively. In an example as shown in FIG. 9, (2), the rise is set in unit 0, and the fall is also set in unit 0. It should be noted that in the case where the vertical synchronizing signal TSVD is output twice, it suffices that unit number n is set in another register which indicates a rise (TSVD2_V_RISE).

The horizontal synchronizing signal TSHD is a signal which indicates the touch drive operation period in each of units. Therefore, it is unnecessary to specify a rising unit and a falling unit. It should be noted that in order that a unit or units in which the horizontal synchronizing signal TSHD is generated include unit n+1 also, it suffices that unit number "(n+1)" is set in a register indicating a valid unit number (VALID_UNIT_NUM). This can inhibit the horizontal synchronizing signal TSHD from being generated in subsequent units.

Referring to FIG. 10, (2), a rise and a fall of the vertical synchronizing signal TSVD are set in unit n and unit n+1, respectively. Also, the rising timing is time at which time set in a register (TSVD_RISE_SHIFT) elapses from the start of unit n. The falling timing is time at which time set in a register (TSVD_FALL_SHIFT) elapses from the start of unit n+1.

Furthermore, the rising timing of the horizontal synchronizing signal TSHD is time at which time set in a register (TSHD_SHIFT) elapses from the start of the touch drive operation. A pulse width of the horizontal synchronizing signal TSHD corresponds to time set in a register (TSHD_WIDTH).

In an H period defined by the rising timing and falling timing of the horizontal synchronizing signal TSHD, drive electrodes for sensor (common electrodes COME) are driven, which are selected based on information on the number of drive electrodes for sensor (common electrodes COME) and a location which are selected in the image display period.

Although the above explanation is given with respect to the drive signal, which is supplied to achieve a basic operation, various touch drive operations can be achieved by combining the above values of the registers and the above timings as appropriate.

To be more specific, the rises, falls and timings of the transfer start pulse SDST, the transfer clock SDCK1, the vertical synchronizing signal TSVD and the horizontal synchronizing signal TSHD are set as appropriate, as a result of which it is possible to freely determine a location and the number of drive electrodes for sensor (common electrodes COME) to be driven. Furthermore, it may be set that with respect to the above setting, a plurality of variations are prepared, and stored in a plurality of tables; and a desired one of the tables is selected, to thereby freely determine a location and the number of drive electrodes for sensor (common electrodes COME) to be driven.

Figure 11:
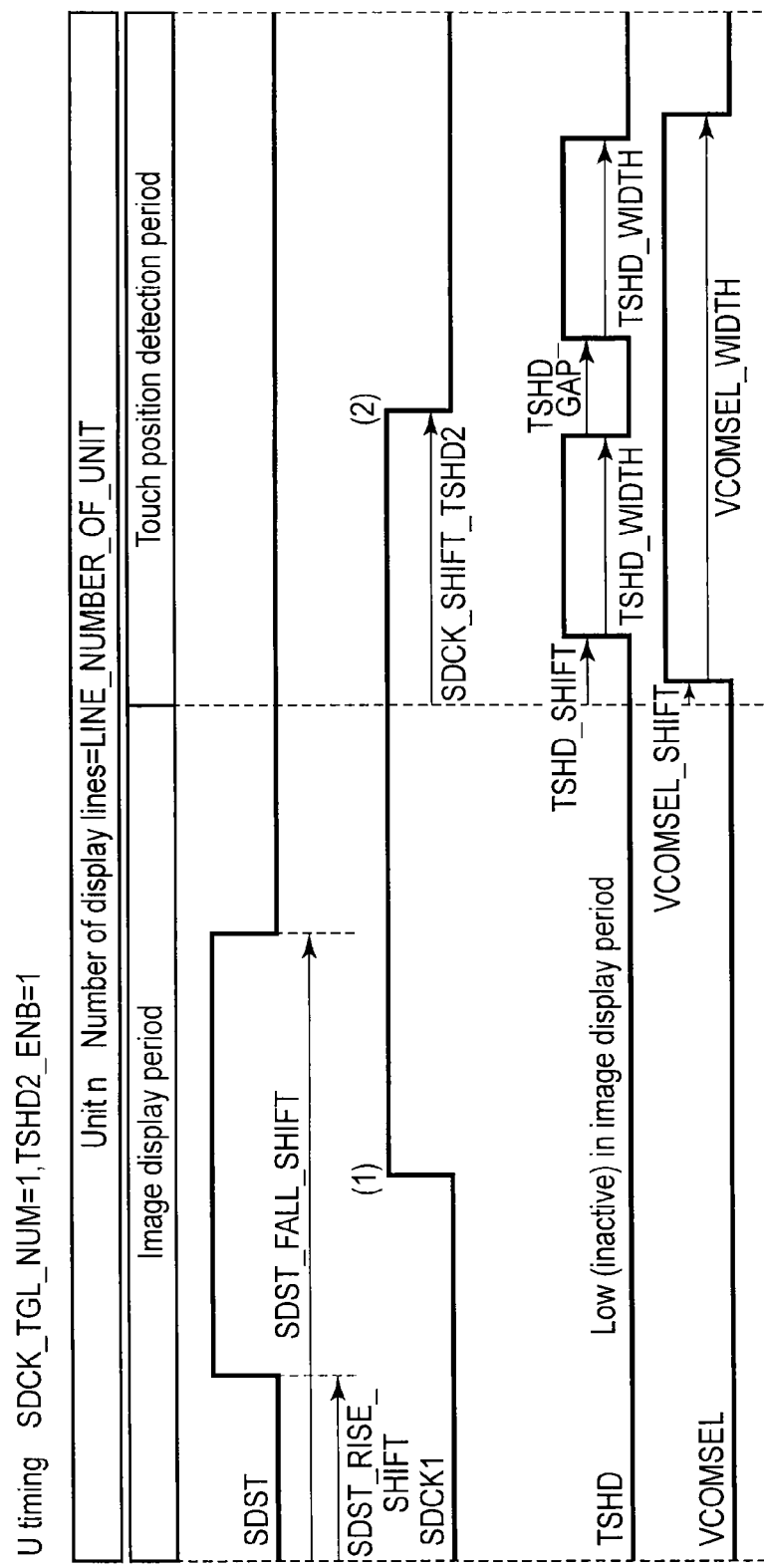
FIG. 11 is a view for explaining a variation of a touch drive operation of the display device having the touch detection function according to the first embodiment.

FIG. 11 is a view for explaining an example (variation) of the touch drive operation of the display device DSP having the touch detection function, according to the first embodiment. The time chart of FIG. 11 indicates an operation in which in a single touch position detection period, shift registers are shift-driven at two stages to execute touch drive two times. In order to specify this operation, for example, the value "1" is set in a register indicating a toggle number (SDCK_TGL_NUM), and the value "1" is set in a register indicating enable (TSHD2_ENB).

More specifically, in the image display period of unit n, since in the H period of the transfer start pulse SDST, the transfer clock SDCK1 varies once, a single drive electrode for sensor (common electrode COME) is selected which is offset relative to a previously selected drive electrode for sensor (common electrode COME) by one drive electrode in the driving direction. The selected single drive electrode for sensor (common electrode COME) is driven when the horizontal synchronizing signal TSHD rises to H in the touch position detection period. Then, when the horizontal synchronizing signal TSHD falls to L, and the transfer clock SDCK1 falls to L once, a further preceding drive electrode for sensor (common electrode COME) is selected, and when the horizontal synchronizing signal TSHD re-rises to H, the further preceding drive electrode for sensor (common electrode COME) is driven.

Referring to FIG. 11, the transfer start pulse SDST rises when time set in a register (SDST_RISE_SHIFT) elapses from the start of unit (0), and falls when time set in a register (SDST_FALL_SHIFT) elapses from the start of unit (0).

In the image display period, the horizontal synchronizing signal TSHD is at low level (L), a selection signal VCOMSEL (inversion signal of EXVCOMSEL) is also at low level (L), and thus a touch drive signal is not supplied to the common electrodes COME. This has no influence upon a display.

When time set in a register (VCOMSEL_SHIFT) elapses from the start of the touch position detection period, the selection signal VCOMSEL rises, and then when time set in a register (VCOMSEL_WIDTH) elapses, the selection signal VCOMSEL falls. In an H period in which the selection signal VCOMSEL is kept at H, a circuit is switched to cause the drive pulses TSVCOM to be supplied to the selected common electrode COME.

When time set in the register (TSHD_SHIFT) elapses from the start of the touch position detection period, the horizontal synchronizing signal TSHD rises, and then time set in the register (TSHD_WIDTH) elapses, the horizontal synchronizing signal TSHD falls. In accordance with rising of the horizontal synchronizing signal TSHD, the drive synchronizing signal EXVCOM is output from the touch driver TPIC, and the drive pulses TSVCOM are supplied to the selected common electrode COME. Thereby, a first touch drive is performed.

On the other hand, the transfer clock SDCK1 falls when time set in a register (SDCK_SHIFT_TSHD2) from the start of the touch position detection period elapses. Thereby, the transfer start pulse SDST is sent to the shift register at a subsequent stage, and the output of the shift register at the subsequent stage is set to "1".

When time set in a register (TSHD_GAP) from the first rising of the horizontal synchronizing signal TSHD elapses, the horizontal synchronizing signal TSHD re-rises, and then when time set in a register (TSHD_WIDTH) elapses, the horizontal synchronizing signal TSHD falls. In accordance with re-rising of the horizontal synchronizing signal TSHD, the drive synchronizing signal EXVCOM is output from the touch driver TPIC, and the drive pulses TSVCOM are supplied to a common electrode COME at the subsequent stage, which is selected. Thereby, a touch drive at the subsequent is performed.

In the above drive method, the touch drive is performed twice in a single touch position detection period. It should be noted that although in the above explanation given with reference to FIG. 11, unit 0 is referred to, the same operation as in unit 0 can also be achieved in an arbitrary unit.

Figure 12:
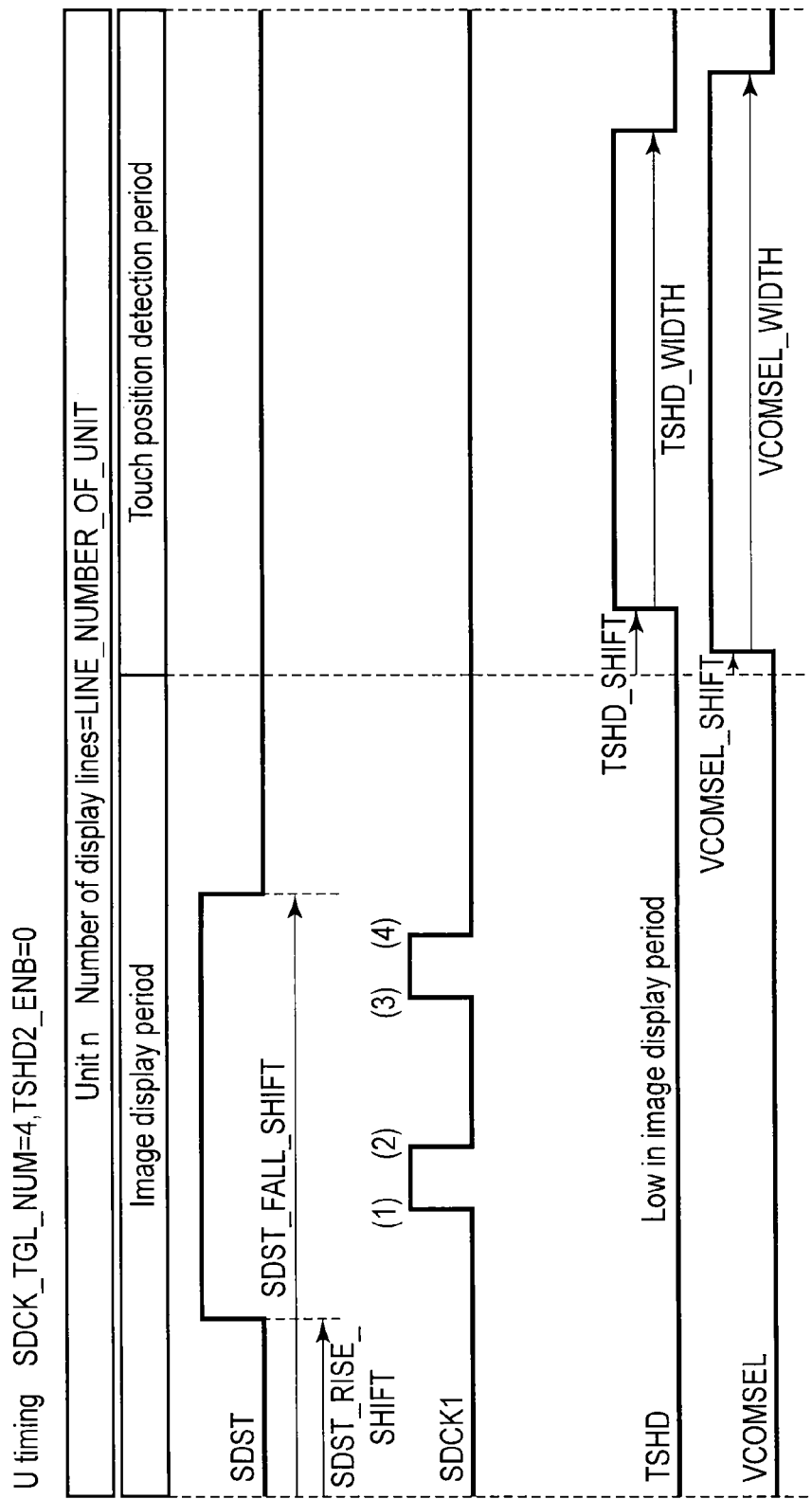
FIG. 12 is a view showing another variation of the touch drive operation of the display device having the touch detection function according to the first embodiment.

FIG. 12 is a view for explaining another example (variation) of the touch drive operation of the display device DSP having the touch detection function, according to the first embodiment. According to the time chart of FIG. 12, in the image display period, four drive electrodes for sensor (four common electrodes COME) are selected, and shift registers are shift-driven at four stages, to thereby perform a touch drive. In this case, it is possible to adopt a method in which in order to select a number of drive electrodes for sensor (common electrodes COME), a corresponding number of shift registers are selected and driven. In order to specify this operation, for example, the value "4" is set in the register indicating the toggle number (SDCK_TGL_NUM), and the value "0" is set in the register indicating enable (TSHD2_ENB). Furthermore, the rising and falling timings of the transfer clock SDCK1 are set by setting respective registers.

When time set in a register (SDCK_NOP) elapses, the transfer clock SDCK1 rises. Thereby, the transfer start pulse SDST is sent to the shift register at the subsequent stage, and the output of the shift register at the subsequent stage is set to "1". Furthermore, when time set in a register (SDCK_DELAY) elapses, the transfer clock SDCK1 falls. Thereby, the transfer start pulse SDST is sent to a shift register at a further subsequent stage, and the output of the shift register at the further subsequent stage is set to "1". In a similar manner, the shift operation is performed four times; and thus in the image display period, shift registers at four stages are skipped. At this time, since the transfer start pulse SDST is at H level, four drive electrodes for sensor (common electrodes COME), which are located subsequent by four, are selected. It should be noted that in the image display period, the horizontal synchronizing signal TSHD is at low level (L), and the selection signal VCOMSEL (inversion signal of EXVCOMSEL) is also at low level (L), as a result of which the touch drive signal is not supplied to the common electrodes COME, and a display is not influenced.

When time set in the register (VCOMSEL_SHIFT) elapses from the start the touch position detection period, the selection signal VCOMSEL rises, and then when time set in the register (VCOMSEL_WIDTH) elapses, the selection signal VCOMSEL falls. In an H period in which the selection signal VCOMSEL is kept at H level, the circuit is switched to supply the drive pulses TSVCOM to the selected common electrode COME.

When time set in a register (TSHD_SHIFT) elapses from the start of the touch position detection period, the horizontal synchronizing signal TSHD rises, and then when time set in the register (TSHD_WIDTH) elapses, the horizontal synchronizing signal TSHD falls. In accordance with rising of the horizontal synchronizing signal TSHD, the drive synchronizing signal EXVCOM is output from the touch driver TPIC, and the drive pulses TSVCOM are supplied to the selected common electrode COME. In the above drive method, since in the image display period, shift registers at four stages are skipped, and thus the touch drive is not performed on common electrodes COME associated with the above shift registers.

Figure 13:
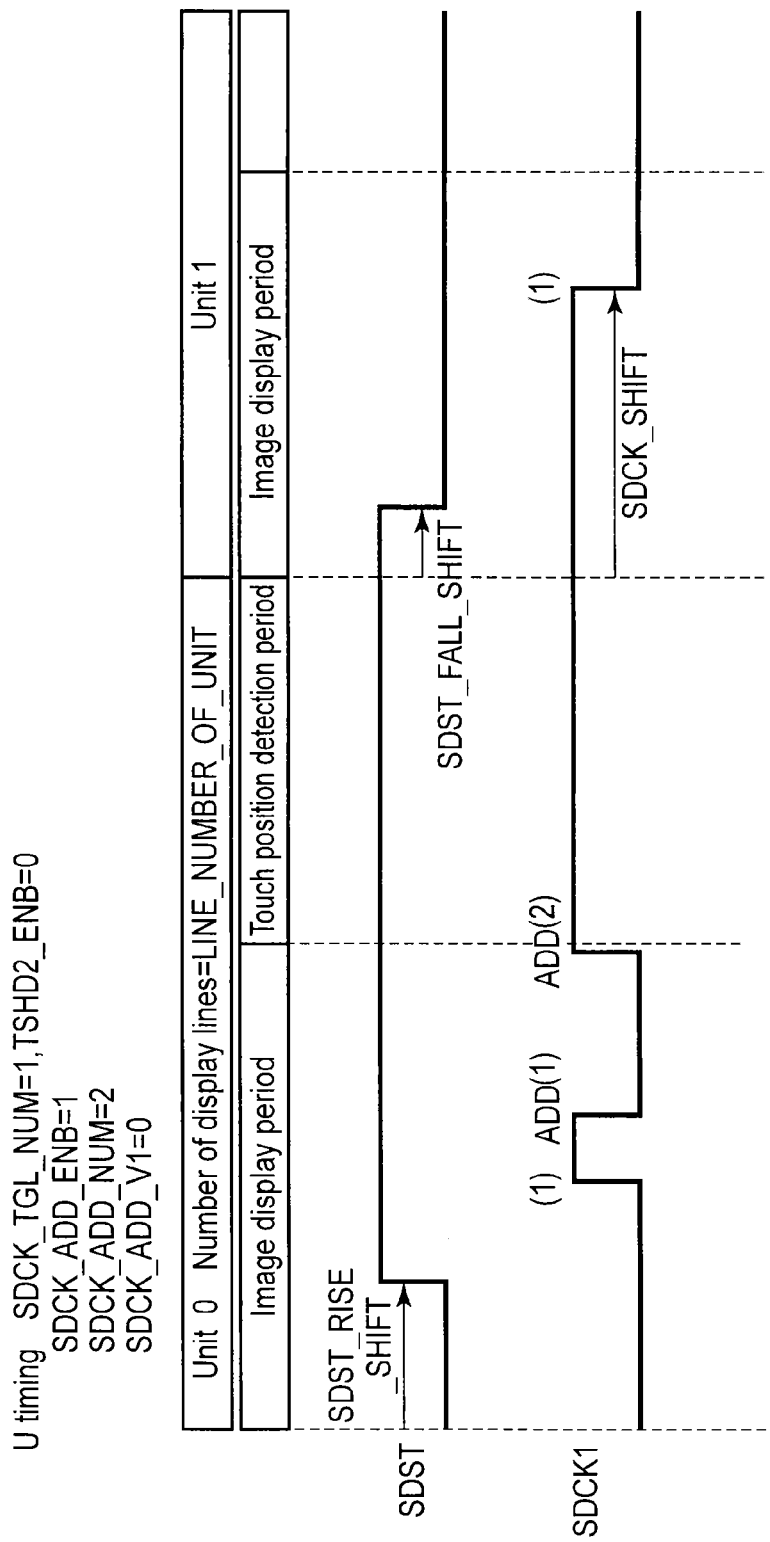
FIG. 13 is a view showing still another variation of the touch drive operation of the display device having the touch detection function according to the first embodiment.

FIG. 13 is a view for explaining still another example (variation) of the touch drive operation of the display device DSP having the touch detection function, according to the first embodiment.

Figure 14:
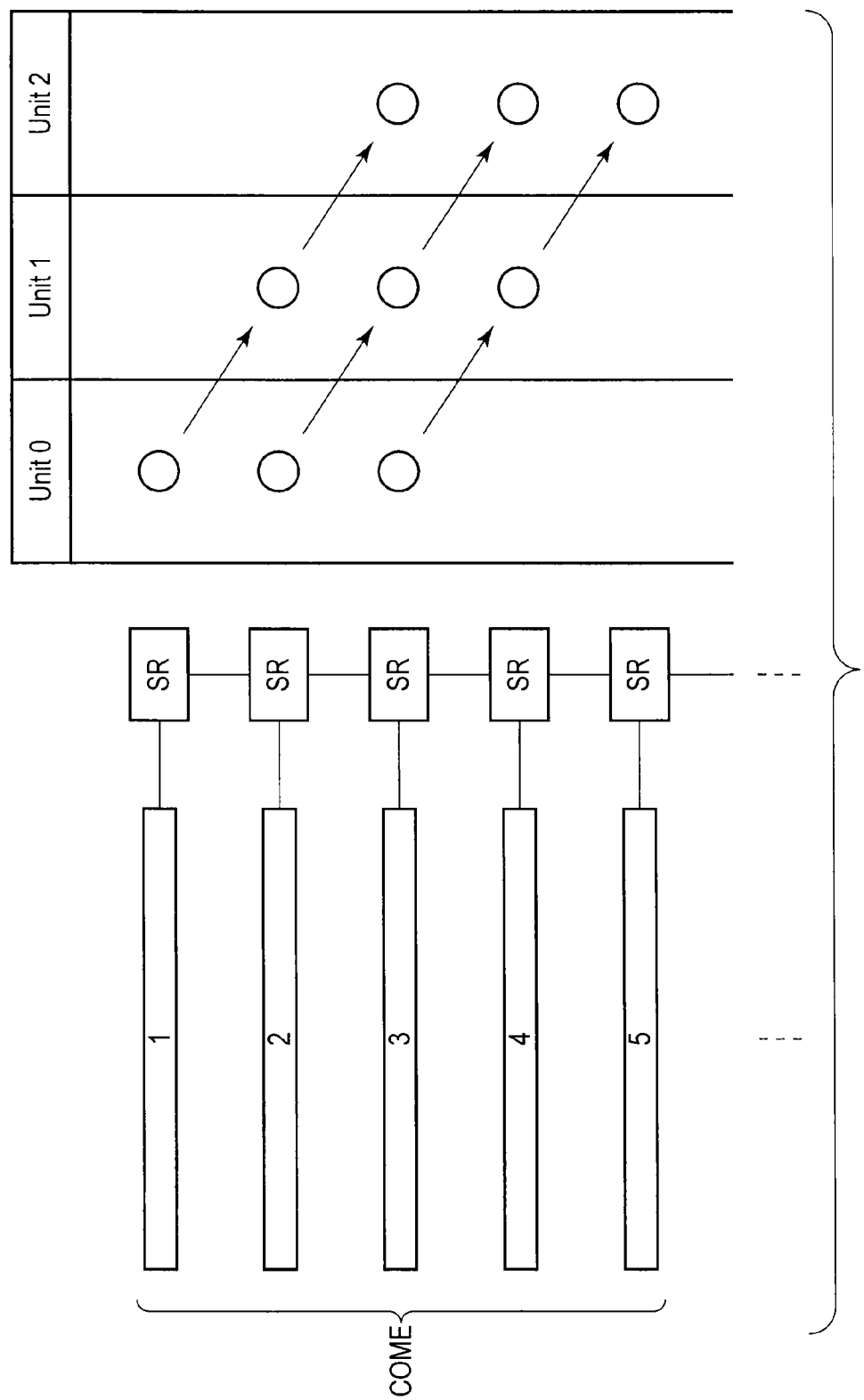
FIG. 14 is a view illustrating the touch drive operation as shown in FIG. 13.

According to the time chart of FIG. 13, shift registers at three stages are driven together to perform the touch drive. As a result, the touch drive is performed on successive common electrodes COME associated with the shift registers at the three stages. FIG. 14 is a view illustrating the touch drive operation as shown in FIG. 13. As shown in FIG. 14, in each of units, a touch drive signal is supplied to common electrodes COME indicated by the mark "○".

In order to specify the above operation, for example, the value "1" is set in the register indicating the toggle number (SDCK_TGL_NUM), and the value "0" is set in the register indicating enable (TSHD2_ENB). The value "0" is set in a register indicating a designation unit (SDCK_ADD_V1), the value "1" is set in a register indicating permission to add SDCK (SDCK_ADD_ENB), and the value "2" is set in a register indicating the number of SDCKs added (SDCK_ADD_NUM).

Referring to FIG. 13, the transfer start pulse SDST rises when the time set in the register (SDST_RISE_SHIFT) elapses from the start of unit 0, and falls when the time set in the register (SDST_FALL_SHIFT) elapses from the start of unit 1. Thus, the transfer start pulse SDST is in the on state during the image display period.

The transfer clock SDCK1 rises when the time set in the register (SDCK_NOP) elapses. Due to this, the transfer start pulse SDST is sent to the shift register at the first stage, and the output of the shift register at the first stage is set to "1".

Then, an additional transfer clock operation is performed two times in a row. To be more specific, the transfer clock SDCK1 falls when the time set in the register (SDCK_DELAY) elapses. Then, the transfer clock SDCK1 rises when the time set in the register (SDCK_NOP) elapses.

Due to the above transfer clock operation performed two time, the transfer start pulse SDST is set to the shift registers at the second and third stages, and the outputs of the those shift registers are set to "1". Therefore, in the image display period of unit 0, the outputs of the three registers are set to "1". That is, three drive electrodes for sensor (three common electrodes COME) connected to the shift registers at the first to third stages are selected. In the touch position detection period of unit 0, the drive pulses TSVCOM are supplied to the common electrodes COME associated with the above three shift registers to perform the touch drive.

The transfer start pulse SDST falls and reaches an Off level, when the time set in the register (SDST_FALL_SHIFT) elapses from the start of the image display period of a subsequent unit, i.e., unit 1. Then, the transfer clock SDCK1 falls when the time set in the register elapses (SDCK_SHIFT) from the start of unit 1. Due to this, the transfer start pulse SDST being at the OFF level is sent to the shift register at the first stage, and the output of the shift register at the first stage is set to "0". On the other hand, the values of three subsequent shift registers are "1". Then, the subsequent shift registers are successively supplied with the transfer start pulse SDST being at the OFF level. To be more specific, when a shift register is supplied with the transfer start pulse SDST being at the OFF level, its output is set to "0", and the values of the other shift registers (shift registers not supplied with the transfer start pulse SDST being at the OFF level) are "1".

According to the above drive method, the touch drive operation is performed with respect to the common electrodes COME associated with the shift registers at the three successive stages.

Second Embodiment

In the second embodiment, a display operation and a touch drive operation are drive-controlled independent of each other. Therefore, it is not always necessary that the positions of lines to be driven in the display operation are the same as those of lines to be driven in the touch drive operation. With the second embodiment, elements identical to those in the first embodiment will be denoted by the same reference numerals as in the first embodiment, and their detailed explanations will be omitted.

When the value "1" is set to a register (V_SYNC_MODE), a display driver DDI performs a touch drive operation independent of the display operation (the second embodiment), and when the value "0" is set in the register (V_SYNC_MODE), the display driver DDI performs a touch drive operation which synchronizes with the display operation (the first embodiment).

FIG. 15 is a view for explaining a drive method in each of the display operation and touch detection operation of a display device DSP having a touch detection function, according to the second embodiment.

FIG. 15 shows a configuration of each of units in the case where 45 is set as the number of a bundle of lines (LINE_NUMBER_OF_UNIT). The unit configuration as shown in FIG. 15 is the same as that explained with reference to FIG. 8, (2). However, in the second embodiment, the display driver DDI uses as a variable parameter, an original control variable LOOP_CNT for controlling the touch drive operation.

In order that the number of effective active lines be 1920, a unit are set for every 45 lines. To be more specific, in each of units 0-41, 45 lines are applied, and in unit 42, 30 lines are applied (1920−45×42). Unit 42 is a dummy unit.

In an example as shown in FIG. 15, a maximum touch unit number (LOOP_MAX_NUM) is set to 29. Thus, in units 0-29, a control variable LOOP_CNT is incremented from 0 to 29. However, in unit 30, the control variable LOOP_CNT is set to 0. Then, it is incremented from 0. After reaching 11 in unit 41, the control variable LOOP_CNT is not incremented in subsequent units. This is because a valid unit number (VALID_UNIT_NUM) is set to 41. Thereafter, from a first unit after a vertical synchronizing signal VD is input, i.e., from unit 0, the control variable LOOP_CNT is re-incremented. That is, the control variable LOOP_CNT in unit 0 is set to 12.

In the first embodiment, the timings of TSVD, SDST, etc., are specified by unit numbers. On the other hand, in the second embodiment, the timings of TSVD, SDST, etc., are specified by values of the control variable LOOP_CNT.

It is possible to achieve various touch drives by applying the drive methods of the first and second embodiments or a combination of the drive methods thereof. As shown in FIG. 7, the display driver DDI includes a plurality of constant tables which specify the timing of the drive signal, etc. A touch driver TPIC outputs a constant-table selection signal which designates any of the above constant tables to a controller 34 in the display driver DDI. The controller 34 sets data described in the designated constant table in the register in the controller 34. A timing controller 31 outputs a drive signal in accordance with the value set in the register. By such a way as described above, various touch drives can be achieved.

To be more specific, the constant tables are made to store data indicating the number of display lines in a single image display period (the number of a bundle of display lines) and the timings of touch drive signals (the output timings of the transfer start pulse SDST, transfer clock SDCK, horizontal synchronizing signal TSHD and vertical synchronizing signal TSVD), and the data is transmitted and received through the register, thereby enabling the touch drive to be flexibly and dynamically changed.

For example, when the touch driver TPIC determines that it is necessary to increase the accuracy of detection of the contact position during operation, a constant table indicating a small number of display lines as a bundle of display lines is selected, to thereby increase the resolution of the sensor. Furthermore, it is possible to increase the resolution of the sensor and the S/N ratio by applying a control method in which the display operation and the touch operation are performed independent of each other, as shown in FIG. 13.

Therefore, even in the case of applying the display driver to various display panels, it is unnecessary to change a pattern to be applied to optimize the display operation and the touch operation, and it is therefore possible to provide a display device having a touch detection function, which can flexibly handle various display specifications and achieve a desired touch operation, and a drive method of the above display device having the touch detection function.

Third Embodiment

With respect to the third embodiment, a configuration example of a drive circuit for achieving a drive method of a display device DSP having a touch detection function will be explained. With respect to the third embodiment, elements identical to those in the first elements will be denoted by the same reference numerals as in the first embodiment, and their explanations will be omitted.

FIG. 16 is a view showing in detail the configuration of a shift register circuit 21 in a touch drive circuit 20 a the display device DSP having a touch detection function according to the third embodiment.

A switching signal SDODD to be described later is input to shift registers SR1, SR2, SR3, . . . , which form the shift register circuit 21. Each of output signals OUT1, OUT2, OUT3, . . . which are output from the shift register SR1, SR2, SR3, . . . , respectively, is input to one of terminals of a respective one of AND circuits 22-1, 22-2, 22-3, . . . . To the other terminal of the respective one of the AND circuits 22-1, 22-2, 22-3, . . . , a horizontal synchronizing signal TSHD is input. A logical product of both the above input signals is output as a VCOM drive signal for touch detection, which is used in selecting drive electrodes (common electrodes COME). It should be noted that in the first embodiment, as shown in FIG. 6, the drive synchronization selection signal EXVCOMSEL which is set to "1" in the touch position detection period is input to the other terminal of the AND circuit 22. In the third embodiment, since the horizontal synchronizing signal TSHD is a signal for identifying a touch position detection period, the same advantage as in the first embodiment can be obtained. Therefore, in the third embodiment also, the drive synchronization selection signal EXVCOMSEL may be applied.

To the first shift register SR1, a transfer start pulse SDST and a transfer clock SDCK1 are further input; and a register output signal Srout1 produced in a circuit provided in the first shift register SR1 is output to the second shift register SR2. The second shift register SR2 produces a register output signal Srout2, using the input register output signal Srout1 and the transfer clock SDCK1, and outputs it to the third shift register SR3. Similarly, in each of remaining stages, a produced register output signal Srout is output to a shift register at a subsequent stage.

Next, the structure and operation of the shift registers will be explained by referring to by way of the shift register SR1 and a circuit connected thereto.

The transfer clock SDCK1 is input to an inverter 1a. After being inverted by the inverter 1a, the signal is input to one of terminals of a NAND circuit f. To the other terminal of the NAND circuit 1f, the switching signal SDODD is input. The output of the NAND circuit 1f is input to one of terminals of an AND circuit 1g.

The transfer start pulse SDST is input to a first input terminal 1b_in1 of an inverter 1b. Furthermore, the transfer clock SDCK1 is input to a second input terminal 1b_in2 of the inverter 1b, and a transfer clock xSDCK1 is input to a third input terminal 1b_in3 of the inverter 1b. It should be noted that when a logic signal of a rising edge is input to the second input terminal 1b_in2, and a logic signal of a falling edge is input the third input terminal 1b_in3, the inverter 1b inverts a logic signal of the first input terminal 1b_in1, and outputs it. The transfer clock xSDCK1 is opposite in phase to the transfer clock SDCK1. That is, the transfer clock xSDCK1 and the transfer clock SDCK1 are clock signals whose potentials are opposite to each other. One of the transfer clocks SDCK1 and xSDCK1 to be input to the inverter 1b (which is the transfer clock xSDCK1 in this case) is inverted and input to the inverter 1b. The inverter 1b inverts and outputs the transfer start pulse SDST, when the values of the transfer clocks SDCK1 and xSDCK1 are both "1".

The output of the inverter 1b is input to an inverter 1c, and the output of the inverter 1c is fed back to an input side of the inverter 1c through an inverter 1d, thereby achieving a latch circuit.

It should be noted that a node 1h which is an intermediate point between the inverter 1b and the inverter 1c is connected to a reference potential through Pch-FET. Therefore, the node 1h can be reset to the reference potential by a rest signal rstb.

The output of the inverter 1c is output as the register output signal Srout1 to the second shift registers SR2, and is also to input the other terminal of the AND circuit 1g. Furthermore, the output signal OUT1 of the AND circuit 1g, as described above, is input to one of the terminals of the AND circuit 22-1.

FIG. 17 is a view for explaining an operation of the shift register circuit 21 in the touch drive circuit 20 in the display device DSP having the touch detection function according to the third embodiment. It should be noted that FIG. 17 shows timings in the case where the switching signal SDODD is at L level (low level: "0"). The operations of the shift register circuit 21 at the timings as shown in FIG. 17 will be explained with reference to FIG. 16.

Referring to FIG. 16, when the switching signal SDODD is at L level, "0" is input to the other terminal of each of NAND circuits 1f, 2f, 3f, . . . of the shift register SR1, SR2, . . . , SR3, and thus the output of each of the NAND circuit 1f, 2f, 3f, . . . is set to "1". Therefore, "1" is necessarily input to an input terminal of each of AND circuits 1g, 2g, 3g, and output signals OUT1, OUT2, OUT3, . . . of the AND circuits 1g, 2g, 3g, . . . are output as the same signals as the register output signals Srout1, Srout2, Srout3, . . . .

In an initial state, the reset signal rstb is input, and the nodes 1h, 2h, 3h, . . . of the shift register SR1, SR2, . . . , SR3, . . . are reset to the reference potential. At timing A in FIG. 17, the transfer start pulse SDST changes to H level (high level: "1"). However, at the timing A, the transfer clock SDCK1 is at L level, and thus the output of the inverter 1b does not change. At timing B in FIG. 17, when the transfer clock SDCK1 changes to H level, the output of the inverter 1b changes to L level which is an inversion signal level of the transfer start pulse SDST, and the register output signal Srout1 is changed to H level by the inverter 1c. It is inverted from H level to L level by the inverter 1d, and the level of the node 1h is held at L level. That is, the state of H level is held by the latch circuit.

The register output signal Srout1 is input to one of terminals of the AND circuit 22-1 through the AND circuit 1g. At timing C in FIG. 17, when the horizontal synchronizing signal TSHD changes to H level, the register output signal Srout1 is at H level, and the output signal OUT1 is also at H level, as a result of which the output signal (the VCOM drive signal for touch detection) of the AND circuit 22-1 changes to H level, and associated common electrodes COME are selected as ones for touch drive. Then, at timing D, when the horizontal synchronizing signal TSHD changes to L level, the common electrodes COME are released from the selected state.

During the above operation, the register output signal Srout1 is output to the second shift register SR2; however, since the transfer clock SDCK1 is at H level, the output of the inverter 2b of the second shift register SR2 does not change.

At timing E, the transfer start pulse SDST changes to L level. This, however, does not change the level of each of the above elements. At timing F, the transfer clock SDCK1 changes to L level. This change also does not cause the inverter 1b of the first shift register SR1 to operate. However, when the transfer clock SDCK1 changes to L level, the inverter 2b of the second shift register SR2 operates, and receives the register output signal Srout1 being at H level. Thereby, the register output signal Srout2 of the second register SR2 changes to H level. It is held at H level by the latch circuit as in the first shift register SR1.

As a result, at timing G, when the horizontal synchronizing signal TSHD changes to H level, two output signals (VCOM drive signals for touch detection), which are output from the AND circuits 22-1 and 22-2, respectively, change to H level, and associated two common electrodes COME are selected as ones for touch drive.

At timing H, the transfer clock SDCK1 changes to H level. As a result, the inverter 1b of the first shift registers SR1 operates, and fetches the transfer start pulse SDST being at L level; and the register output signal Srout1 changes to L level. On the other hand, the register output signal Srout3 of the third shift register SR3 is changed to H level by the same operation as in the timing B in the first shift register SR1. As a result, at timing I, when the horizontal synchronizing signal TSHD changes to H level, two output signals (VCOM drive signals for touch detection) which are output from the AND circuits 22-2 and 22-3, respectively, change to H level, and associated two common electrodes COME are selected as ones for touch drive.

At timing J, the transfer clock SDCK1 changes to L level. As a result, the inverter 2b of the second shift register SR2 operates, and the register output signal Srout1 being at L level is input to the inverter 2b. Thereby, the register output signal Srout2 changes to L level. On the other hand, the inverter 4b of the fourth shift register SR4 operates in the same manner as in the above-mentioned operation, and the register output signal Srout4 changes to H level. It is held at H level by the latch circuit.

As explained above, according to the time chart of FIG. 17, two successive common electrodes COME are selected as ones for touch drive. The positions of two common electrodes COME to be selected are advanced one by one in synchronism with the transfer clock SDCK1.

Figure 18:
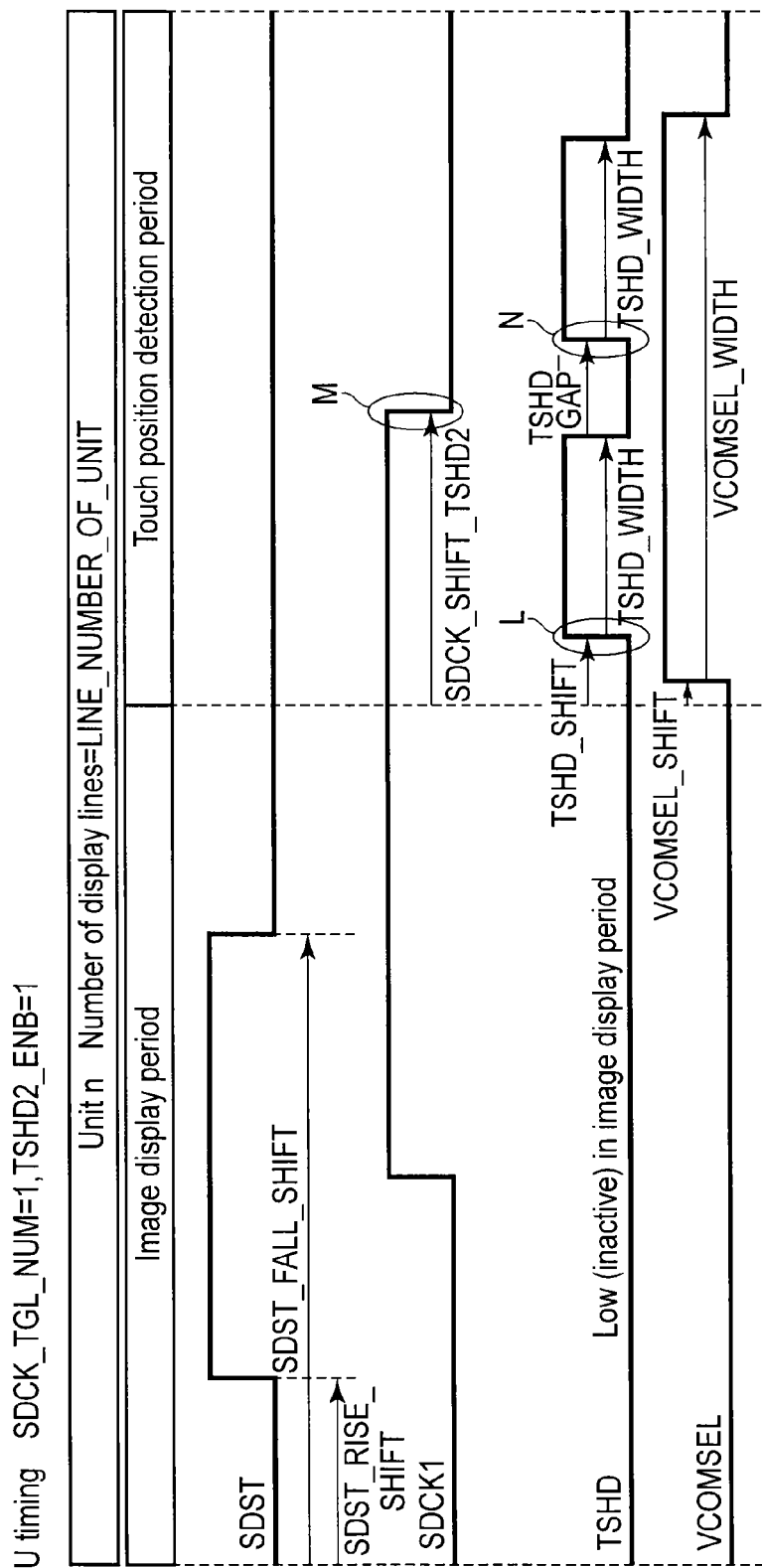
FIG. 18 is a view for explaining a variation of the operation of the shift register circuit in the touch drive circuit in the display device having the touch detection function according to the third embodiment.

FIG. 18 is a view showing a variation of an operation of the shift register circuit 21 in the touch drive circuit 20 in the display device DSP having the touch detection function, according to the third embodiment. It should be noted that FIG. 18 shows timings in the case where the switching signal SDODD is at L level. The operation of the shift register circuit 21 in each of the timings as shown in FIG. 18 will be explained with reference to FIG. 16. It should be noted that an explanation of part of the operation which is the same in content as that explained with reference to FIG. 17 will be omitted as appropriate.

In the image display period as shown in FIG. 18, when the transfer start pulse SDST is at H level, the transfer clock SDCK1 changes to H level. Thereby, the register output signal Srout1 of the first shift register SR1 changes to H level. At timing L, when the horizontal synchronizing signal TSHD changes to H level, the output signal (the VCOM drive signal for touch detection) of the AND circuit 22-1 changes to H level, and associated common electrodes COME are selected as ones for touch drive.

At timing M, the transfer clock SDCK1 changes to L level. Thereby, the register output signal Srout2 of the second shift register SR2 changes to H level. As a result, the output signal (the VCOM drive signal for touch detection) of the AND circuit 22-2 changes to H level, and associated two common electrodes COME are selected as ones for touch drive. In such a manner, it is possible to increase or change the number of common electrodes COME to be selected by changing the transfer clock SDK1.

An operation which is a combination of changing of the transfer clock SDK1 and that of the horizontal synchronizing signal TSHD is continuously applied to unit n, whereby in the first half of the touch position detection period, a plurality of common electrodes COME can be driven, and in the latter half of the touch position detection period, a plurality of common electrodes COME offset relative to the above former plurality of common electrode by one stage in the driving direction can be driven.

FIG. 19 is a view showing another variation of the operation of the shift register circuit 21 in the touch drive circuit 20 in the display device DSP having the touch detection function, according to the third embodiment. Also, FIG. 19 shows timings in the case where the switching signal SDODD is at L level. The operation of the shift register circuit 21 at each of the timings as shown in FIG. 19 will be explained with reference to FIG. 16. It should be noted that an explanation of part of the operation which is the same in content as that explained with reference to FIG. 17 will be omitted as appropriate.

Referring to FIG. 19, in the image display period, when the transfer start pulse SDST is at H level, the transfer clock SDCK1 changes four times at timings P. To be more specific, in accordance with the above operation of the shift register circuit 21, at timing P1, the output signal (the VCOM drive signal for touch detection) of the AND circuit 22-1 changes to H level; at timing P2, the output signal of the AND circuit 22-2 changes to H level; at timing P3, the output signal of the AND circuit 22-3 changes to H level; and at timing P4, the output signal of the AND circuit 22-4 changes to H level.

As a result, four successive common electrodes COME can be selected as ones for touch drive.

In the drive operation in the case where the switching signal SDODD is at L level as explained above, if the transfer start pulse SDST is at H level, common electrodes COME are selected the number of which is determined in accordance with the number N (N is an integer of 1 or more) of times the transfer clock SDCK1 changes. Also, if the transfer start pulse SDST is at L level, each time the transfer clock SDCK1 varies, further N drive electrodes are selected which are offset relative to previously selected N drive electrodes by one drive electrode in the driving direction.

Next, an example of the drive operation in the case where the switching signal SDODD is at H level will be explained.

Figure 20:
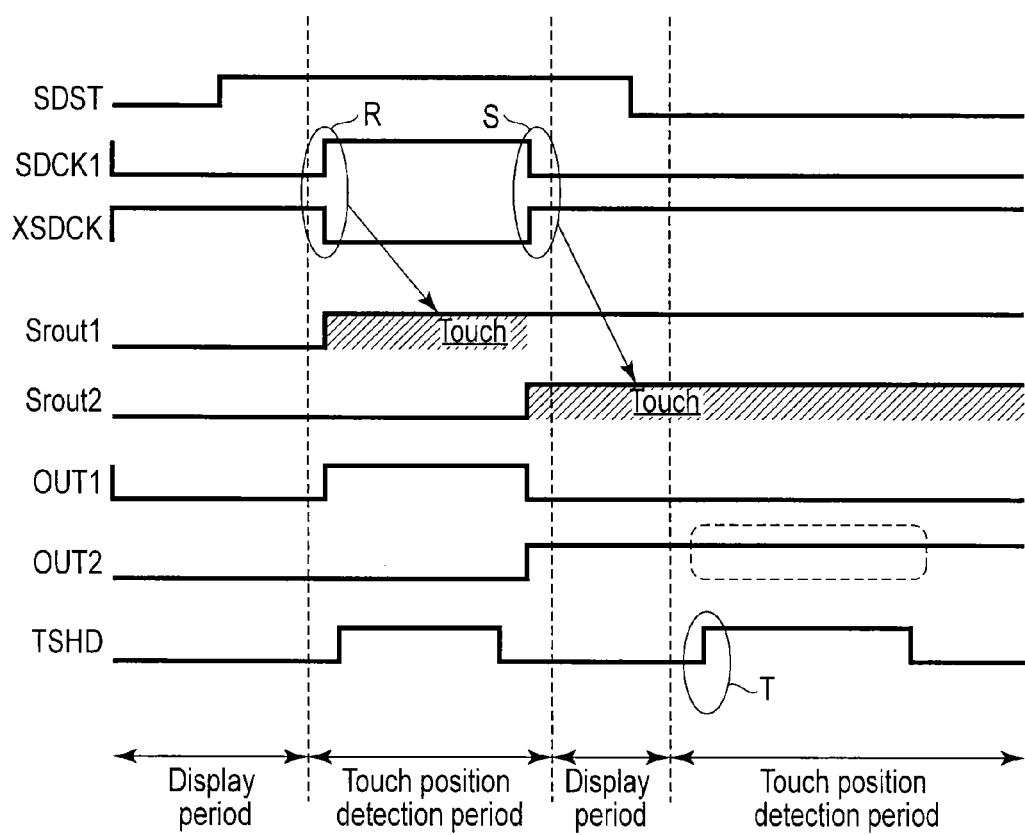
FIG. 20 is a view for explaining still another variation of the operation of the shift register circuit in the touch drive circuit in the display device having the touch detection function according to the third embodiment.

FIG. 20 is a view for explaining still another variation of the operation of the shift register circuit 21 in the touch drive circuit 20 in the display device DSP having the touch detection function, according to the third embodiment. Also, FIG. 20 shows timings in the case where the switching signal SDODD is at H level. The operation of the shift register circuit 21 at each of the timings as shown in FIG. 20 will be explained with reference to FIG. 16. It should be noted that an explanation of part of the operation which is the same in content as that explained above will be omitted as appropriate.

At timing R as shown in FIG. 20, when the transfer start pulse SDST is at H level, the transfer clock SDCK1 changes to H level. At this time, referring to FIG. 16, since the output of the inverter 1a changes to L level, the output of the NAND circuit 1f changes to H level. As a result, the output signal OUT1 changes to H level since the register output signal Srout1 is at H level.

At timing S as shown in FIG. 20, when the transfer start pulse SDST is at H level, the transfer clock SDCK1 changes to L level. At this time, referring to FIG. 16, since the output of the inverter 1a changes to H level, the output of the NAND circuit 1f changes to L level. As a result, the output signal OUT1 changes to L level. On the other hand, as described above, since the register output signal Srout1 is at H level, the output of an inverter 2a changes to L level, and the output of a NAND circuit 2f changes to H level. As a result, the output signal OUT2 changes to H level since the register output signal Srout2 is at H level.

Therefore, at timing T, when the horizontal synchronizing signal TSHD changes to H level, a single common electrodes COME associated with the output signal OUT2 is selected as one for touch drive.

Figure 21:
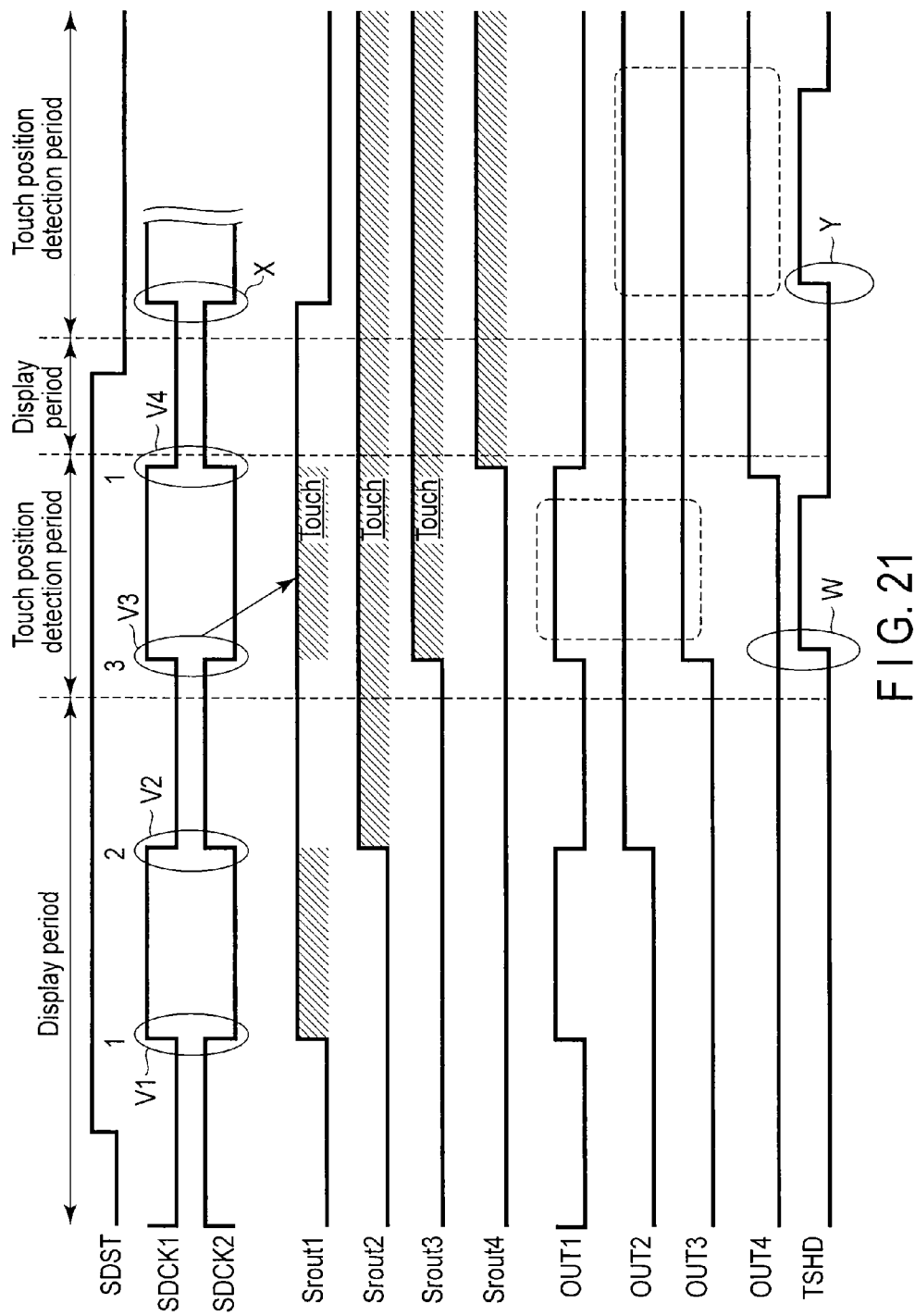
FIG. 21 is a view for explaining a further variation of the operation of the shift register circuit in the touch drive circuit in the display device having the touch detection function according to the third embodiment.

FIG. 21 is a view for explaining a further variation of the operation of the shift register circuit 21 in the touch drive circuit 20 in the display device DSP having the touch detection function, according to the third embodiment. Also, FIG. 21 shows timings in the case where the switching signal SDODD is at H level. The operation of the shift register circuit 21 at each of the timings as shown in FIG. 21 will be explained with reference to FIG. 16. It should be noted that an explanation of part of the operation which is the same in content as that explained above will be omitted as appropriate.

Referring to FIG. 21, when the transfer start pulse SDST is at H level, the transfer clock SDCK1 varies four times at timings V1-V4. The operation at each of timing V1 and V2 is the same as that explained with reference to FIG. 20, and its explanation will thus be omitted. At timing V3, since the transfer clock SDCK1 changes to H level, as described above, the output signal OUT1 changes to H level, since the register output signal Srout1 is at H level. Since the register output signal Srout1 is kept at H level from timing V1, the output of the NAND circuit 2f changes to H level. As a result, the output signal OUT2 is kept at H level, since the register output signal Srout2 is at H level.

At timing W, when the horizontal synchronizing signal TSHD changes to H level, three common electrodes COME associated with the output signals OUT1-OUT3 are selected as ones for touch drive.

At timing V4, since the transfer clock SDCK1 changes to L level, as described above, the output signal OUT1 changes to L level. On the other hand, as described above, as the register output signals Srout1-Srout3 are at H level, the output of the inverter 4a is set to L level, and that of a NAND circuit 4f is set to H level. As a result, the output of the output signal OUT4 is changes to H level, since the register output signal Srout4 is at H level.

In a subsequent period, the transfer start pulse SDST changes to L level, and then at timing X, when the transfer clock SDCK1 changes, the register output signal Srout1 changes to L level, and the output signal OUT1 also changes to L level. Therefore, at timing Y, when the horizontal synchronizing signal TSHD changes to H level, three common electrodes COME associated with the output signals OUT2-OUT4 are selected as ones for touch drive.

Thereafter, in accordance with the change of the level of the transfer clock SDCK1, a "three-bundle, single-shift drive" in which common electrodes COME are successively selected as common electrodes COME for touch drive, such that three successive common electrodes COME are offset relative to previously selected three common electrodes COME by one drive electrode in the driving direction.

In the drive operation in which the switching signal SDODD is at H level as explained above, when the transfer start pulse SDST is at H level, drive electrodes (common electrodes COME) are selected the number (N−1) of which is smaller by 1 than the number N (N is an integer of 1 or more) of times the transfer clock SDCK1 varies. Furthermore, when the transfer start pulse SDST is at L level, an (N−1) number of drive electrodes are selected which are offset relative to the above selected drive electrodes by one drive electrode in the driving direction, each time the transfer clock SDCK1 changes.

In the shift register circuit 21 in the third embodiment as explained above, when the transfer start pulse SDST is at H level, drive electrodes (common electrodes COME) the number M (M is an integer of 1 or more) of which is determined in accordance with the number of times the transfer clock SDCK1 varies are selected. Furthermore, when the transfer start pulse SDST is at L level, an M number of drive electrodes which are located offset relative to the above selected drive electrodes by one drive electrode in the driving direction are selected each time the transfer clock SDCK1 changes.

Also, in the shift register circuit 21 in the third embodiment, various touch drive methods can be achieved by variously combining the output timings of the transfer start pulse SDST and the transfer clock SDCK1.

Fourth Embodiment

In the fourth embodiment, a drive circuit for achieving a drive method of a display device DSP having a touch detection function has a different structure from that of the third embodiment. With respect to the fourth embodiment, elements identical to those of the third embodiment will be denoted by the same reference numerals as in the third embodiment, and their detailed explanations will be omitted.

FIG. 22 is a view showing in detail a configuration of a shift register circuit 21 in a touch drive circuit 20 in the display device DSP having the touch detection function, according to the fourth embodiment.

Each of the output signals OUT1, OUT2, . . . of shift registers SR1, SR2, . . . included in the shift register circuit 21 is input to one of terminals of a respective one of AND circuits 22-1, 22-2, . . . . To the other terminal of each of the AND circuits 22-1, 22-2, . . . , a horizontal synchronizing signal TSHD is input. A logical product of those input signals is output as the VCOM drive signal for touch detection. Furthermore, each of the shift register SR1, SR2, . . . includes sub shift registers SRa and SRb.

To the first shift register SR1, the transfer start pulse SDST and the transfer clock SDCK1 are input. The transfer start pulse SDST is input to the sub shift register Sra as a register input signal ina. An output signal OUT1 which is produced by a circuit provided in the sub shift register Sra is input to the sub shift register SRb as a register input signal inb. An output signal produced by a circuit in the sub shift register SRb is input to the sub shift register SRa of the second shift register SR2 as the register input signal ina. An output signal produced by the sub shift registers SRa and SRb of the second shift register SR2 are input to a third shift register SR3 not shown. Thereafter, similarly, the register input signal ina is output to a shift register SR of a subsequent stage.

Next, the structure and operation of the shift register circuit 21 will be explained by referring to by way of the first shift register SR1 and a circuit connected thereto.

The transfer start pulse SDST (input signal ina) is input to one of terminals of a NOR circuit 1a1. To the other terminal of the NOR circuit 1a1, a negative feedback signal backa to be describe later is input. An output of the NOR circuit 1a1 is branched into two outputs. A signal from one of the two outputs is supplied to a gate of an Nch transistor (transistor T1) included in a switch circuit 1a4 through an inverter 1a3, and the other output is connected to a gate of a Pch transistor (transistor T2) included in the switch circuit 1a4. Furthermore, the output of the NOR circuit 1a1 is connected to a gate of an Nch transistor 1a5.

It should be noted that a source terminal of the transistor T1 and a drain terminal of the transistor T2 are connected to each other, and the transfer clock SDCK1 are input to them. A drain terminal of the transistor T1 and a source terminal of the transistor T2 are also connected to each other, and are connected to a drain terminal of a transistor 1a5. A source terminal of the transistor 1a5 is given a power-supply voltage Vss (low potential). It should be noted that in the switch circuit 1a4, the transistors T1 and T2 are connected in parallel with each other; and electrical conduction is effected in the transistors T1 and T2 when the transfer clock SDCK1 is at H level, and electrical conduction is not effected in the transistors T1 and T2 when the transfer clock SDCK1 is at L level.

The drain terminal of the transistor 1a5 supplies the negative feedback signal backa to the other terminal of the NOR circuit 1a1. Furthermore, from a two-series inverter circuit 1a7 connected to the drain terminal of the transistor 1a5, the output signal OUT1 is output to one of terminals of the AND circuit 22-1. Also, the output signal OUT1 from the two-series inverter circuit 1a7 is input as the register input signal inb to the sub shift register SRb.

It should be noted that a node 1a8 which is an intermediate point between the NOR circuit 1a1 and the inverter 1a3 is connected to a power-supply voltage Vdd (high potential)

through Pch-FET1a2. Therefore, the node 1a8 can be reset to the reference potential by a reset signal xDisc.

The register input signal inb input to the sub shift register SRb is input to one of terminals of a NOR circuit 1b1. To the other terminal of the NOR circuit 1b1, a negative feedback signal backb to be described later is input. An output of the NOR circuit 1b1 is branched into two outputs. One of the two outputs is connected to a gate of an Nch transistor (transistor T3) included in a switch circuit 1b4 through the inverter 1b3, and the other is connected to a gate of a Pch transistor (transistor T4) included in the switch circuit 1b4. Furthermore, an output signal from the NOR circuit 1b1 is supplied to a gate of a Pch transistor 1b5 through the inverter 1b3.

It should be noted that to both a source terminal of the transistor T3 and a drain terminal of the transistor T4, the transfer clock SDCK1 is input. A drain terminal of the transistor T3 and a source terminal of the transistor T4 are connected to a drain terminal of the transistor 1b5. A source terminal of the transistor 1b5 is given a power-supply voltage Vdd (high potential). It should be noted that in the switch circuit 1b4, the transistors T3 and T4 are connected in parallel with each other; and electrical conduction is effected in the transistors T3 and T4 when the transfer clock SDCK1 is at L level, and electrical conduction is not effected in the transistors T3 and T4 when the transfer clock SDCK1 is at H level.

A drain terminal of the transistor 1b5 is connected to the inverter 1b6. An output signal from the inverter 1b6 is supplied as the negative feedback signal backb to the other terminal of the NOR circuit 1b1. Also, from a two-series inverter circuit 1b7 connected to the inverter 1b6, the register input signal ina is output, and input to the sub shift register Sra of the shift register SR2 at a subsequent stage.

It should be noted that a node 1b8 which is an intermediate point between the NOR circuit 1b1 and the inverter 1b3 is connected to a power-supply voltage Vdd (high potential) which is the reference potential through Pch-FET1b2. Therefore, the node 1b8 can be reset to the reference potential by the reset signal xDisc.

In such a manner, the shift register SR1 comprises the sub shift registers SRa and SRb. From the sub shift register Sra, an output signal for producing the VCOM drive signal for touch detection is output. On the other hand, from the sub shift register SRb, the output signal for producing the VCOM drive signal for touch detection is not output.

Subsequent shift register SR2, . . . are identical to the shift register SR1, and their explanations will thus be omitted.

Figure 23:
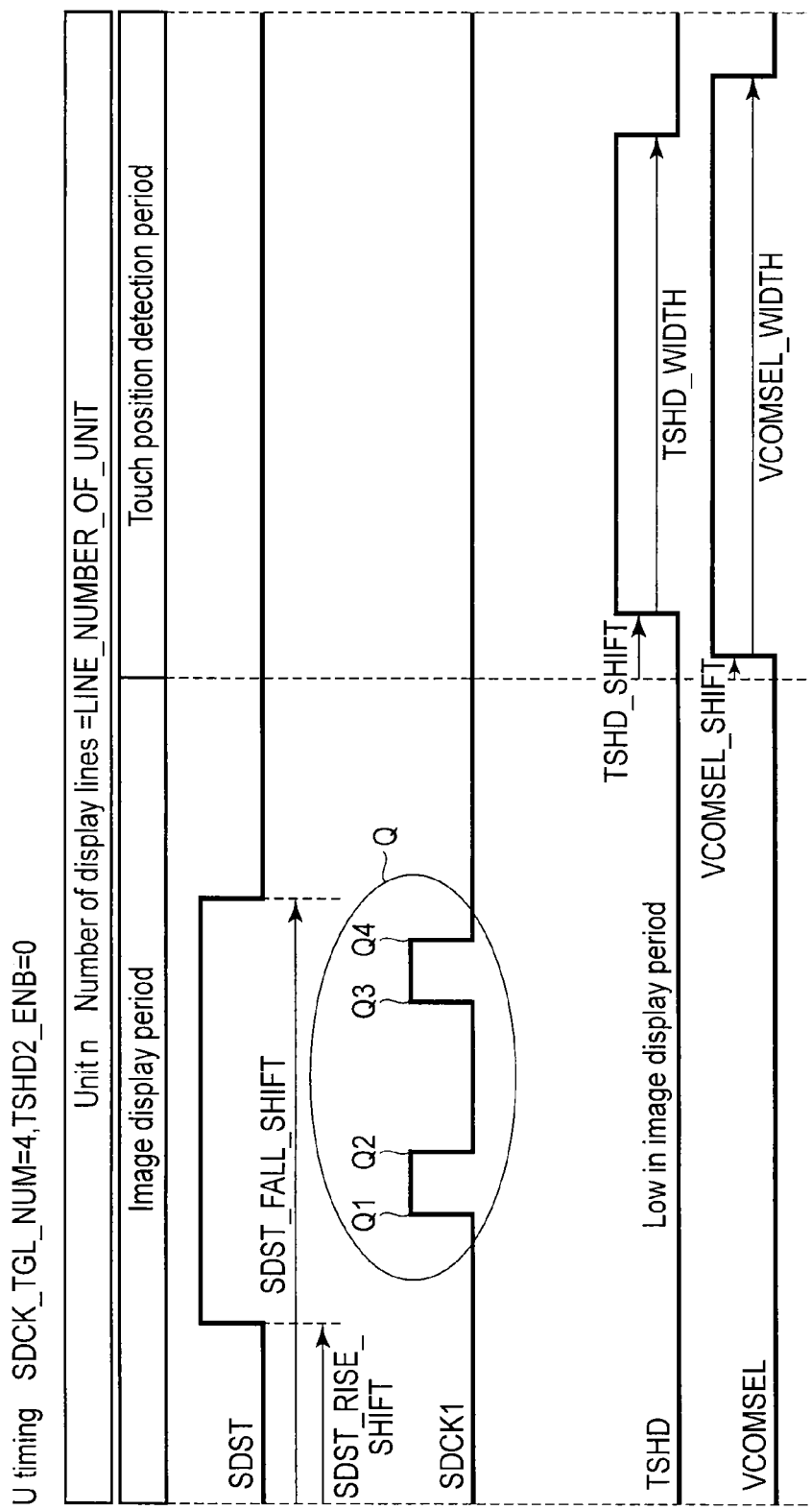
FIG. 23 is a view for explaining an operation of the shift register circuit in the touch drive circuit in the display device having the touch detection function, according to the fourth embodiment.

FIG. 23 is a view for explaining an operation of the shift register circuit 21 in the touch drive circuit 20 in the display device DSP having the touch detection function, according to the fourth embodiment. The operation of the shift register circuit 21 will be explained with reference to FIGS. 22 and 23.

[Initialization Reset Operation]

In the sub shift register Sra in the shift register SR1, when the reset signal xDisc changes from H level (="1") to L level (="0"), electrical conduction is effected between the source and drain of Pch-FET1a2, and a high potential Vdd is applied to the node 1a8. As a result, electrical conduction is effected between the source and drain of the transistor 1a5, and the negative feedback signal backa is given a potential of L level. At this time, since the transfer start pulse SDST is at L level, the output of the NOR circuit 1a1 changes to H level, and this state is thus latched. It should be noted that since the output signal OUT1 is at L level, the VCOM drive signal for touch detection is not output.

Also, in the sub shift register SRb, when the reset signal xDisc changes from H level to L level, electrical conduction is effected between the source and drain of Pch-FET1b2, and a high potential Vdd is applied to the node 1b8. As a result, since electrical conduction is effected between the source and drain of the transistor 1b5, and a potential of H level is applied to the inverter 1b6, the negative feedback signal backb is given a potential of L level. At this time, since the register input signal inb is at L level, the output of the NOR circuit 1b1 changes to H level. Therefore, this state is latched. Furthermore, the register input signal ina changes to L level, and is input to the shift register SR2 of a subsequent stage.

Subsequent shift registers, i.e., the shift registers SR2, SR3, . . . , are also set to an initialization state in the above manner.

An operation in which as shown in FIG. 23, the transfer start pulse SDST changes to H level, and at timing Q, the transfer clock SDCK1 changes four times will be explained.

When the transfer start pulse SDST (the register input signal ina) changes to H level, the output of the NOR circuit 1a1 in the sub shift register Sra changes to L level. As described above, the switch circuit 1a4 is designed such that the transistors T1 and T2 are connected in parallel with each other, and electrical conduction is effected in the transistors T1 and T2 when the transfer clock SDCK1 is at H level, and electrical conduction is not effected in the transistors T1 and T2 when the transfer clock SDCK1 is at L level. Thus, when the transfer clock SDCK1 is at L level, the negative feedback signal backa maintains a potential of L level which is a potential at a reset time. Therefore, the register input signal inb and the output signal OUT1 of the shift register SR1 do not change, and also, the outputs of subsequent shift registers SR do not change.

At timing Q1, when the transfer clock SDCK1 changes to H level, the switch circuit 1a4 operates, and thus the output of the two-series inverter circuit 1a7 changes to H level. That is, the output signal OUT1 which is at the H level is output to one of the terminals of the AND circuit 22-1, and the AND circuit 22-1 enters a state in which it can output the VCOM drive signal for touch detection. At this time, the negative feedback signal backa also changes to H level, and the output of the NOR circuit 1a1 is kept at L level.

Since the register input signal inb input to the sub shift register SRb changes to H level, the output of the NOR circuit 1b1 changes to L level. As described above, the switch circuit 1b4 is designed such that the transistors T3 and T4 are connected in parallel with each other, and electrical conduction is effected in the transistors T3 and T4 when the transfer clock SDCK1 is at L level, and electrical conduction is not effected in the transistors T3 and T4 when the transfer clock SDCK1 is at H level. Thus, when the transfer clock SDCK1 is at H level, an input to the inverter 1b6 is kept at H level, and is equivalent to that in the initialization state. Therefore, the output of the sub shift register SRb does not change, and subsequent shift registers, i.e., the shift registers SR2, SR3, . . . , do not change.

Since in the sub shift register Sra, as described above, the switch circuit 1a4 is designed such that the transistors T1 and T2 are connected in parallel with each other, at timing Q2, when the transfer clock SDCK1 changes to L level, electrical conduction is not effected in the transistors T1 and T2 when the transfer clock SDCK1 is at L level. Therefore, the negative feedback signal backa and the output of the two-series inverter circuit 1a7 are kept at H level.

On the other hand, in the sub shift register SRb, as described above, the switch circuit 1b4 is designed such that the transistors T3 and T4 are connected in parallel with each other, and electrical conduction is effected in the transistors T3 and T4 when the transfer clock SDCK1 is at L level. Thus, the output of the inverter 1b6 changes to H level, the negative feedback signal backb also changes to H level, and the output of the NOR circuit 1b1 is kept as L level.

In the sub shift register Sra in the shift register SR2, although the register input signal ina changes to H level, the transfer clock SDCK1 is at L level. Thus, the output signal OUT2 is kept at L level as in the sub shift register SRa in the shift register SR1.

At timing Q3, when the transfer clock SDCK1 changes to H level, since this state is maintained, the sub shift registers SRa and SRb of the shift register SR1 keep the output signal OUT1 at H level. On the other hand, the sub shift registers SRa and SRb of the shift register SR2 operate in the same manner as the sub shift registers SRa and SRb of the shift register SR1 operate at the timing Q1 as described above. Therefore, the output signal OUT2 changes to H level.

At timing Q4, when the transfer clock SDCK1 changes to L level, since this state is maintained, the sub shift registers SRa and SRb of the shift register SR1 keep the output signal OUT1 at H level. On the other hand, the sub shift registers SRa and SRb of the shift register SR2 operate in the same manner as the sub shift registers SRa and SRb of the shift register SR1 operate at the timing Q2 as described above. Therefore, the output signal OUT2 is kept at H level.

As explained above, when the transfer start pulse SDST is at H level, the transfer clock SDCK1 changes four times at timing Q1-Q4. In accordance with this change, at two timings at which the transfer clock SDCK1 change to H level, two drive electrodes (common electrodes COME) can be selected.

As is clear from the above explanation, when the transfer start pulse SDST is at L level, a subsequent common electrode can be selected each time the transfer clock SDCK1 changes to H level.

In each of the shift register circuits 21 in the third and fourth embodiments, when the transfer start pulse SDST is at H level, an M (M is an integer of 1 or more) number of drive electrodes (common electrodes COME) are selected, the M number being determined in accordance with the number of times the transfer clock SDCK1 changes. When the transfer start pulse SDST is at L level, an M number of drive electrodes are selected which are offset relative to the above former M number of drive electrodes in the driving direction by the number of drive electrodes which is determined in accordance with the number of times the transfer clock SDCK1 changes.

It should be noted that in each of the third and fourth embodiments, the H and L levels of the transfer start pulse SDST and the transfer clock SDCK1 are not limited to those in the above-mentioned feature. The shift register circuit 21 can be configured to operate at a potential level opposite to that explained above, by changing characteristics (Pch, Nch) of transistors used in the shift register circuit 21.

Fifth Embodiment

The configuration of the fifth embodiment is similar to that as shown in FIG. 16 with reference to FIG. 16. Referring to FIG. 16, an inverter 1b is designed such that at timing at which the voltage of a second input terminal 1b_in2 changes from L level to H level (the voltage of a third input terminal 1b_in3 changes from H level to L level), a signal of a first input terminal 1b_in1 is inverted and output. The same is true of inverters 2b, 3b, . . . .

FIG. 24 is a view showing in detail a configuration of a shift register circuit 21 in a touch drive circuit 20 in a display device DSP having a touch detection function, according to the fifth embodiment.

The configuration shown in FIG. 24 is different from that in FIG. 16 on the following point: inverters 1b, 2b, 3b, . . . , 1d, 2d, 3d, . . . , operate as inverters when their second input terminals are at H level (their first input terminals are at L level), and their outputs are set at a high impedance when the second input terminals are at L level (the first input terminals are at H level). A configuration example of the inverters 1b, 2b, 3b, . . . , 1d, 2d, 3d, . . . is shown in FIG. 25. An inverter as shown in FIG. 25 includes: an inverter unit comprising a Pch transistor and an Nch transistor; and a switch unit comprising a Pch transistor and an Nch transistor. For example, in the inverter 1b, an input of the inverter unit is set as a first input terminal 1b_in1; a gate of the Nch transistor of the switch unit is set as a second input terminal 1b_in2; and a gate of the Pch transistor is set as a third input terminal 1b_in3. The same is true of the inverters 2b, 3b, . . . , 2d, 3d, . . . .

Furthermore, successive shift registers are each supplied with two kinds of transfer clocks differing in phase from each other, i.e., a first transfer clock SDCK1 (xSDCK1) and a second transfer clock SDCK2 (xSDCK2). For example, shift registers at odd-numbered stages (the first shift register SR1, the third shift register SR3, . . . ) are supplied with the first transfer clock SDCK1 (xSDCK1), and shift registers at even-numbered stages (the second shift register SR2, the fourth shift register SR4, . . . ) are supplied with the second transfer clock SDCK2 (xSDCK2).

The number of common electrodes COME to be handled as a bundle of common electrodes COME and a location offset relative to a previously selected location in the driving direction can be set as appropriate by determining appropriately the phases and timings of the first transfer clock SDCK1 (xSDCK1) and the second transfer clock SDCK2 (xSDCK2).

In the shift register circuit 21 in the fifth embodiment as explained above, when the transfer start pulse SDST is at H level, an M (M is an integer of one or more) number of drive electrodes (common electrodes COME) are selected, the M number being determined in accordance with the number of times the first transfer clock SDCK1 and the second transfer clock SDCK2 change. Furthermore, when the transfer start pulse SDST is at L level, an M number of drive electrodes are selected which are offset relative to the above former selected M number of drive electrodes in the driving direction by the number of times the first transfer clock SDCK1 and the second transfer clock SDCK 2 change.

It should be noted that the present invention is not limited to such a panel structure as described with respect to each of the embodiments.

With respect to the embodiments, a panel using a liquid crystal which is of a lateral electric-field type such as an in-plane switching (IPS) mode or a fringe-field switching (FFS) mode is referred to by way of example; however, the panel in each of the embodiments is not limited to such a type of panel. That is, the embodiments can also be applied to a panel using a liquid crystal which is of a vertical electric-field type such as a twisted nematic (TN) mode or an optically compensated bend (OCB) mode.

Furthermore, with respect to the embodiments, as the display device having the touch detection function, a so-called in-cell type display device is referred to by way of example. However, the embodiment can also be applied to a so-called on-cell type display device in which a touch panel is provided on a display surface of the display device.

All display devices which can be put to practical use by a person with ordinary skill in the art by changing as appropriate the designs of the display devices according to the above embodiments are covered by the disclosure of the present application, as long as they have the subject matter of the present invention.

It can be understood that various modifications of the embodiments of the present invention can be conceived by a person with ordinary skill in the art, and also fall within the scope of disclosure of the present application with respect to the present invention. For example, with respect to the above embodiments, if a person with ordinary skill in the art adds or deletes a structural element or changes a design as appropriate, or adds or omits a step or changes a design, a modification obtained by such a change also falls within the scope of disclosure of the present application with respect to the present invention, as long as it has the subject matter of the present invention.

Furthermore, in addition to the above advantages obtained by the above embodiments, if another or other advantages can be obviously considered to be obtained in the embodiment or embodiments from the specification or can be conceived as appropriate by a person with ordinary sill in the art from the specification, it is understood that such another or other advantages can also be obtained by the present invention.

It is also possible to make various inventions by combining as appropriate, structural elements as disclosed with respect to the above embodiments. For example, some of the structural elements in the embodiments may be deleted. Also, structural elements used in both the embodiments may be combined as appropriate.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A touch drive device comprising:
a plurality of drive electrodes arranged side by side to extend in a single direction;
a detection electrode extending in a direction crossing the direction in which the drive electrodes extends, and provided to generate capacitances at intersections of the detection electrode and the drive electrodes;
a driver (DDI) which groups the plurality of drive electrodes into a plurality of drive electrode portions each including at least one drive electrode, and performs a touch drive by supplying a touch drive signal (TSV-COM) having a pulse waveform for detection of a closely situated external object to a target drive electrode portion which is a selected one of the plurality of drive electrode portions; and
a shift register circuit which is shift-driven to enable the drive electrode portions to be successively selected,
wherein the number of the drive electrodes included in each of the drive electrode portions and the target drive electrode portion to which the touch drive signal (TSV-COM) is supplied are allowed to be designated,
wherein the driver (DDI) outputs a clock signal (SDCK) and a start pulse signal (SDST) for shift-driving the shift register circuit,
wherein the shift register circuit is configured to:
cause M (M is an integer of 1 or more) drive electrode portions of the plurality of drive electrode portions to be selectable, when the start pulse signal (SDST) is in one of potential states, the M being determined in accordance with the number of times the clock signal (SDCK) changes, and
cause M drive electrode portions of the plurality of drive electrode portions, which are offset relative to the selectable M drive electrode portions in a driving direction by the number of drive electrodes which is determined in accordance with the number of times the clock signal (SDCK) changes, to be selectable, when the start pulse signal (SDST) is in the other potential state;
wherein the shift register circuit includes a plurality of shift registers connected in series to each other,
of the shift registers included in the shift register circuit, shift registers at odd-numbered stages each comprise:
a first inverter which inverts a signal input from a shift register at a previous stage, when the clock signal (SDCK) is in one of potential states;
a second inverter which inverts an output of the first inverter, and outputs the inverted output as a signal for causing the drive electrode portions to be selectable, to a shift register at a subsequent stage; and
a third inverter which inverts an output of the second inverter, and feeds back the inverted output to an input of the second inverter;
of the shift registers included in the shift register circuit, shift registers at even-numbered stages each comprise:
a fourth inverter which inverts a signal input from a shift register at a precedent stage, when the clock signal (SDCK) is in the other of the potential states;
a fifth inverter which inverts an output of the fourth inverter, and outputs the inverted output as a signal for causing the drive electrode portions to be selectable, to a shift register at a subsequent stage, and
a sixth inverter which inverts an output of the fifth inverter, and feeds back the inverted output to an input of the fifth inverter; and
of the shift registers included in the shift register circuit, a shift register at a first stage is supplied with the start pulse signal (SDST) instead of an output signal from the shift register at the precedent stage;
wherein the shift registers included in the shift register circuit further each comprise:
a NAND circuit which performs an NAND operation on a switching signal (SDODD) and a signal obtained by inverting a signal input from the shift register at the precedent stage; and
an AND circuit which performs an AND operation on an output signal of the AND circuit and an output signal of one of the second inverter and the fifth inverter to obtain a signal for causing the drive electrode portion to be selectable, and outputs the obtained signal, and
wherein the shift register at the first stage is supplied with the start pulse signal (SDST) instead of an output signal from the shift register at the precedent stage.

2. The touch drive device according to claim 1, wherein the driver (DDI) alternately repeats a display operation and a touch drive operation in a time sharing manner, and outputs during the touch drive operation, a selection signal (VCOMSEL) indicating that the touch drive operation is being performed; and in the display operation, a display signal is output to the display device, and in the touch drive operation, the touch drive signal (TSVCOM) is output.

3. The touch drive device according to claim 2, wherein the driver (DDI) outputs the touch drive signal (TSV-COM) to the target drive electrode portion when the target drive electrode portion is made selectable, and the target drive electrode portion made selectable is supplied with the touch drive signal (TSVCOM) when the selection signal (VCOMSEL) is output.

4. The touch drive device according to claim 3, wherein the driver (DDI) produces a horizontal synchronizing signal (TSHD) designating a time period in which the touch drive signal (TSVCOM) is to be output, and rising and falling timings of the start pulse signal (SDST), the clock signal (SDCK), the horizontal synchronizing signal (TSHD) and the selection signal (VCOMSEL) are allowed to be designated.

5. The touch drive device according to claim 4, wherein the driver (DDI) includes a plurality of data tables specifying the rising timings and falling timings of the start pulse signal (SDST), the clock signal (SDCK), the horizontal synchronizing signal (TSHD) and the selection signal (VCOMSEL), and the driver (DDI) produces, using a designated one of the data tables, the start pulse signal (SDST), the clock signal (SDCK), the horizontal synchronizing signal (TSHD) and the selection signal (VCOMSEL).

6. A touch drive device comprising:
a plurality of drive electrodes arranged side by side to extend in a single direction;
a detection electrode extending in a direction crossing the direction in which the drive electrodes extends, and provided to generate capacitances at intersections of the detection electrode and the drive electrodes;
a driver (DDI) which groups the plurality of drive electrodes into a plurality of drive electrode portions each including at least one drive electrode, and performs a touch drive by supplying a touch drive signal (TSV-COM) having a pulse waveform for detection of a closely situated external object to a target drive electrode portion which is a selected one of the plurality of drive electrode portions; and
a shift register circuit which is shift-driven to enable the drive electrode portions to be successively selected,
wherein the number of the drive electrodes included in each of the drive electrode portions and the target drive electrode portion to which the touch drive signal (TSV-COM) is supplied are allowed to be designated,
wherein the driver (DDI) outputs a clock signal (SDCK) and a start pulse signal (SDST) for shift-driving the shift register circuit,
wherein the shift register circuit is configured to:
cause M (M is an integer of 1 or more) drive electrode portions of the plurality of drive electrode portions to be selectable, when the start pulse signal (SDST) is in one of potential states, the M being determined in accordance with the number of times the clock signal (SDCK) changes, and
cause M drive electrode portions of the plurality of drive electrode portions, which are offset relative to the selectable M drive electrode portions in a driving direction by the number of drive electrodes which is determined in accordance with the number of times the clock signal (SDCK) changes, to be selectable, when the start pulse signal (SDST) is in the other potential state;

wherein the shift register circuit includes a plurality of shift registers connected in series to each other, and each of the shift registers includes a first sub shift register and a second sub shift register, the first sub shift register comprises:
a first NOR circuit which performs an NOR operation on a signal input from a shift register at a precedent stage and a first feedback signal;
a first P channel transistor including a gate terminal which is connected to an output terminal of the first NOR circuit, and a drain terminal to which the clock signal (SDCK) is input;
a first inverter which inverts an output signal of the first NOR circuit;
a first N channel transistor including a gate terminal which is connected to an output terminal of the first inverter, and a source terminal to which the clock signal (SDCK) is input;
a third N channel transistor including a gate terminal which is connected to an output terminal of the first NOR circuit, a drain terminal which is connected to a source terminal of the first P channel transistor and a drain terminal of the first N channel transistor, and a source terminal which is connected to a low potential; and
a first two-series inverter which converts a signal from the drain terminal of the third N channel transistor into a signal for causing the drive electrode portions to be selectable, and outputs the signal to the second sub shift register; and the second sub shift register comprises:
a first NOR circuit which performs a NOR operation on a signal input from the first sub shift register and a second feedback signal;
a second P channel transistor including a gate terminal which is connected to an output terminal of the second NOR circuit, and a drain electrode to which the clock signal (SDCK) is input;
a second inverter which inverts an output signal of the second NOR circuit;
a second N channel transistor including a gate terminal which is connected to an output terminal of the second inverter, and a source terminal to which the clock signal (SDCK) is input;
a fourth P channel transistor including a gate terminal which is connected to an output terminal of the second inverter, a drain terminal which is connected to a source terminal of the second P channel transistor and a drain terminal of the second N channel transistor, and a source terminal which is connected to a high potential;
a fourth inverter which inverts a signal from a drain terminal of the fourth P channel transistor; and
a second two-series inverter which converts an output signal of the fourth inverter into a signal for causing the drive electrode portions to be selectable, and outputs the signal to the shift register at the subsequent stage;

the first feedback signal is output from a drain terminal of the third N channel transistor,
the second feedback signal is output from fourth inverter, and
the first sub shift register in the shift register at the first stage is supplied with the start pulse signal (SDST) instead of an output signal form the shift register at the precedent stage.

7. The touch drive device according to claim 6, wherein the driver (DDI) alternately repeats a display operation and a touch drive operation in a time sharing manner, and outputs during the touch drive operation, a selection signal (VCOMSEL) indicating that the touch drive operation is being performed; and in the display operation, a display signal is output to the display device, and in the touch drive operation, the touch drive signal (TSVCOM) is output.

8. The touch drive device according to claim 7, wherein the driver (DDI) outputs the touch drive signal (TSVCOM) to the target drive electrode portion when the target drive electrode portion is made selectable, and the target drive electrode portion made selectable is supplied with the touch drive signal (TSVCOM) when the selection signal (VCOMSEL) is output.

9. The touch drive device according to claim 8, wherein the driver (DDI) produces a horizontal synchronizing signal (TSHD) designating a time period in which the touch drive signal (TSVCOM) is to be output, and rising and falling timings of the start pulse signal (SDST), the clock signal (SDCK), the horizontal synchronizing signal (TSHD) and the selection signal (VCOMSEL) are allowed to be designated.

10. The touch drive device according to claim 9, wherein the driver (DDI) includes a plurality of data tables specifying the rising timings and falling timings of the start pulse signal (SDST), the clock signal (SDCK), the horizontal synchronizing signal (TSHD) and the selection signal (VCOMSEL), and the driver (DDI) produces, using a designated one of the data tables, the start pulse signal (SDST), the clock signal (SDCK), the horizontal synchronizing signal (TSHD) and the selection signal (VCOMSEL).

* * * * *